(12) United States Patent
Fukuda et al.

(10) Patent No.: US 7,928,640 B2
(45) Date of Patent: Apr. 19, 2011

(54) LIGHT-EMITTING DISPLAY APPARATUS INCORPORATING A CIRCULAR POLARIZER IN ARRANGEMENT WITH A LIGHT-ABSORBING MEMBER

(75) Inventors: Koichi Fukuda, Tokyo (JP); Ryuichiro Isobe, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 28 days.

(21) Appl. No.: 12/620,175

(22) Filed: Nov. 17, 2009

(65) Prior Publication Data

US 2010/0060156 A1 Mar. 11, 2010

Related U.S. Application Data

(62) Division of application No. 11/688,738, filed on Mar. 20, 2007, now Pat. No. 7,671,528.

(30) Foreign Application Priority Data

Mar. 30, 2006 (JP) ................ 2006-094556
Feb. 7, 2007 (JP) ................ 2007-027942

(51) Int. Cl.
  *H01J 61/40* (2006.01)
  *H01L 51/52* (2006.01)
(52) U.S. Cl. ......... 313/112; 313/501; 313/110; 313/506
(58) Field of Classification Search .......... 313/500–512, 313/110–113
See application file for complete search history.

(56) References Cited

U.S. PATENT DOCUMENTS

| 4,539,507 A | 9/1985 | VanSlyke et al. ............ 313/504 |
| 4,720,432 A | 1/1988 | VanSlyke et al. ............ 428/457 |
| 4,885,211 A | 12/1989 | Tang et al. .................... 428/457 |
| 2002/0093284 A1 | 7/2002 | Adachi et al. ................ 313/506 |
| 2002/0190639 A1 | 12/2002 | Yamada et al. .............. 313/504 |
| 2004/0051445 A1 | 3/2004 | Adachi ......................... 313/504 |
| 2004/0156405 A1 | 8/2004 | Asai et al. ...................... 372/39 |
| 2005/0179371 A1* | 8/2005 | Broer et al. .................... 313/506 |
| 2005/0194896 A1 | 9/2005 | Sugita et al. .................. 313/506 |
| 2005/0253494 A1 | 11/2005 | Choi ............................. 313/112 |
| 2006/0113904 A1* | 6/2006 | Bae et al. ...................... 313/506 |
| 2006/0187384 A1* | 8/2006 | Hisatake ....................... 349/113 |
| 2006/0238118 A1* | 10/2006 | Spindler ....................... 313/506 |
| 2006/0284532 A1* | 12/2006 | Kurihara et al. ............. 313/110 |

FOREIGN PATENT DOCUMENTS

JP  07-142170  6/1995
(Continued)

OTHER PUBLICATIONS

Japanese Office Action issued in the counterpart application No. 2007-027942 dated Sep. 28, 2010—4 pages.
(Continued)

*Primary Examiner* — Mariceli Santiago
(74) *Attorney, Agent, or Firm* — Fitzpatrick, Cella, Harper & Scinto

(57) ABSTRACT

A display apparatus includes a substrate; a plurality of pixels arranged above the substrate, each including a plurality of sub-pixels emitting light of different colors; a circularly polarizing member disposed above the pixels, the transmittance of light of a selected color through the circularly polarizing member being higher than that of light of the other colors therethrough; and a light-absorbing member disposed only above the sub-pixels, emitting light of the non-selected colors. The light-absorbing member absorbs light of the selected color.

9 Claims, 15 Drawing Sheets

FOREIGN PATENT DOCUMENTS

| | | |
|---|---|---|
| JP | 09127885 A | 5/1997 |
| JP | 2002-373776 | 12/2002 |
| JP | 2004-030955 | 1/2004 |
| JP | 2004-164890 | 6/2004 |
| JP | 2005-332815 | 12/2005 |

OTHER PUBLICATIONS

Tang et al., "Organic Electroluminescent Diodes," *Appl. Phys. Lett.*, vol. 51, No. 12, 913-915 (1987).

* cited by examiner

LIGHT-EMITTING DISPLAY APPARATUS INCORPORATING A CIRCULAR POLARIZER IN ARRANGEMENT WITH A LIGHT-ABSORBING MEMBER

CROSS-REFERENCE TO RELATED APPLICATIONS

This application is a divisional application of U.S. application Ser. No. 11/688,738 filed Mar. 20, 2007, which claims priority of Japanese Patent Application Nos. 2006-094556, filed Mar. 30, 2006 and 2007-027942, filed Feb. 7, 2007. The contents of all of the aforementioned applications are hereby incorporated by reference herein in their entireties.

BACKGROUND OF THE INVENTION

1. Field of the Invention

The present invention relates to display apparatuses including light-emitting devices and particularly relates to a display apparatus including organic electroluminescent (EL) diodes which emit light upon application of electric fields to thin films containing an organic compound.

2. Description of the Related Art

Organic EL diodes include anodes, cathodes, and thin films which contain fluorescent or phosphorescent organic compounds and which are sandwiched between the anodes and cathodes. The organic EL diodes emit light when electrons and holes are injected into the thin films from the cathodes and the anodes, respectively, and when the electrons are combined with the holes to generate excitons from the fluorescent or phosphorescent organic compound. The excitons transit from an excited state to a ground state and light is emitted. A study conducted by Eastman Kodak Company in 1987 reports on a diode having two layers with different functions in Appl. Phys. Lett., 51, p. 913, (1987). The diode has a brightness of about 1,000 cd/m² at an applied voltage of about 10 V. The diode includes an anode made of indium tin oxide (ITO) and a cathode made of a silver-magnesium (Ag—Mg) alloy and contains an aluminum-quinolinol complex having an electron-transporting ability and a light-emitting ability and a triphenylamine derivative having a hole-transporting ability. Patens relating to the diode include U.S. Pat. Nos. 4,539,507, 4,720,432, and 4,885,211.

FIG. 1A shows an ordinary organic EL diode, which includes a reflective electrode 102, a transparent electrode 103 located on the side from which light is extracted, and an organic layer 101 sandwiched therebetween. A first light beam 202 emitted from a light-emitting point 201 is transmitted to the transparent electrode 103 and a second light beam 203 emitted therefrom is reflected by the reflective electrode 102 and then transmitted toward the transparent electrode 103. Hence, the amount of light extracted through the transparent electrode 103 is large, that is, the organic EL diode has increased light-emitting efficiency.

An external light beam 301 incident on the organic EL diode is reflected by the reflective electrode 102 as shown in FIG. 1B. Therefore, there is a problem in that a display including the organic EL diode has low contrast and visibility. This problem is not peculiar to organic EL displays but is common to light-emitting displays, such as quantum-dot light-emitting diode (QD-LED) displays, inorganic EL displays, and plasma displays, including reflective electrodes.

In order to improve low contrast images, a technique is employed in which right-or left-circularly polarized light is converted into left-or right-circularly polarized light, respectively, by reflection. Japanese Patent No. 2761453 and Japanese Patent Laid-Open No. 2005-332815 each discloses a technique in which the reflection of external light is prevented by placing a circularly polarizing plate on the side from which light is extracted.

Alternatively, to improve contrast and prevent reflection, interference is generated in a stack of thin films having a thickness of several ten to several hundred micrometers. Japanese Patent No. 3555759 discloses a technique in which interference occurring in an optical resonator is used in combination with a monochromatic absorption filter and a technique in which interference occurring in an optical resonator is used in combination with red, green, and blue color filters each corresponding to a pixel.

Although the circularly polarizing plate used in the technique disclosed in Japanese Patent No. 2761453 has a simple structure and is superior in preventing the reflection of light, ordinary circularly polarizing plates have a transmittance of 35% to 45% in the visible range (the theoretical upper limit of the transmittance is 50%). Therefore, there is a problem in that the use of such circularly polarizing plates reduces by half the light-emitting efficiency of organic EL diodes independently of display colors. In order to solve this problem, Japanese Patent Laid-Open No. 2005-332815 discloses that the spectral transmittance of a circularly polarizing plate and/or the degree of spectral polarization thereof is varied depending on the light-emitting efficiency of an organic EL diode.

However, there is a problem in that if light-emitting efficiency is increased by increasing the spectral transmittance of a circularly polarizing member, the ability of preventing the reflection of external light is deteriorated because an increase in spectral transmittance reduces the degree of spectral polarization and the polarizing ability of the circularly polarizing member.

SUMMARY OF THE INVENTION

The present invention provides a high-contrast display apparatus with high efficiency.

A display apparatus according to an embodiment of the present invention includes a substrate; a plurality of pixels, arranged above the substrate, each including a plurality of sub-pixels emitting light of different colors; a circularly polarizing member disposed above the pixels, the transmittance of light of a selected one color of said different colors through the circularly polarizing member being higher than that of light of the other colors therethrough; and a light-absorbing member disposed only above the sub-pixels, emitting light of the other of said different colors. The light-absorbing member absorbs light of the selected color.

A display apparatus according to another embodiment of the present invention includes a substrate; a plurality of pixels, arranged above the substrate, each including a plurality of sub-pixels which emit light of different colors and which each include a light-emitting diode including a first electrode, a light-emitting layer, and a second electrode arranged above the substrate in that order; and a circularly polarizing member disposed above the pixels, the transmittance of light of a selected one dolor of said different colors through the circularly polarizing member being higher than that of light of the other of said different colors therethrough. The sub-pixels emitting light of the selected color each have a first reflecting plane located at a position closer to the first electrode than the light-emitting layer and a second reflecting plane located at a position closer to the second electrode than the light-emitting layer. The optical distance between the first and second reflecting planes is set such that an external light component which is reflected by the first reflecting plane and which has a wavelength corresponding to the selected color interferes with an external light component which is reflected by the second reflecting plane and which has a wavelength corresponding to the selected color, whereby the external light components are attenuated.

According to the present invention, a high-contrast display apparatus with high efficiency can be achieved.

Further features of the present invention will become apparent from the following description of exemplary embodiments with reference to the attached drawings.

DESCRIPTION OF THE EMBODIMENTS

Figure 3:
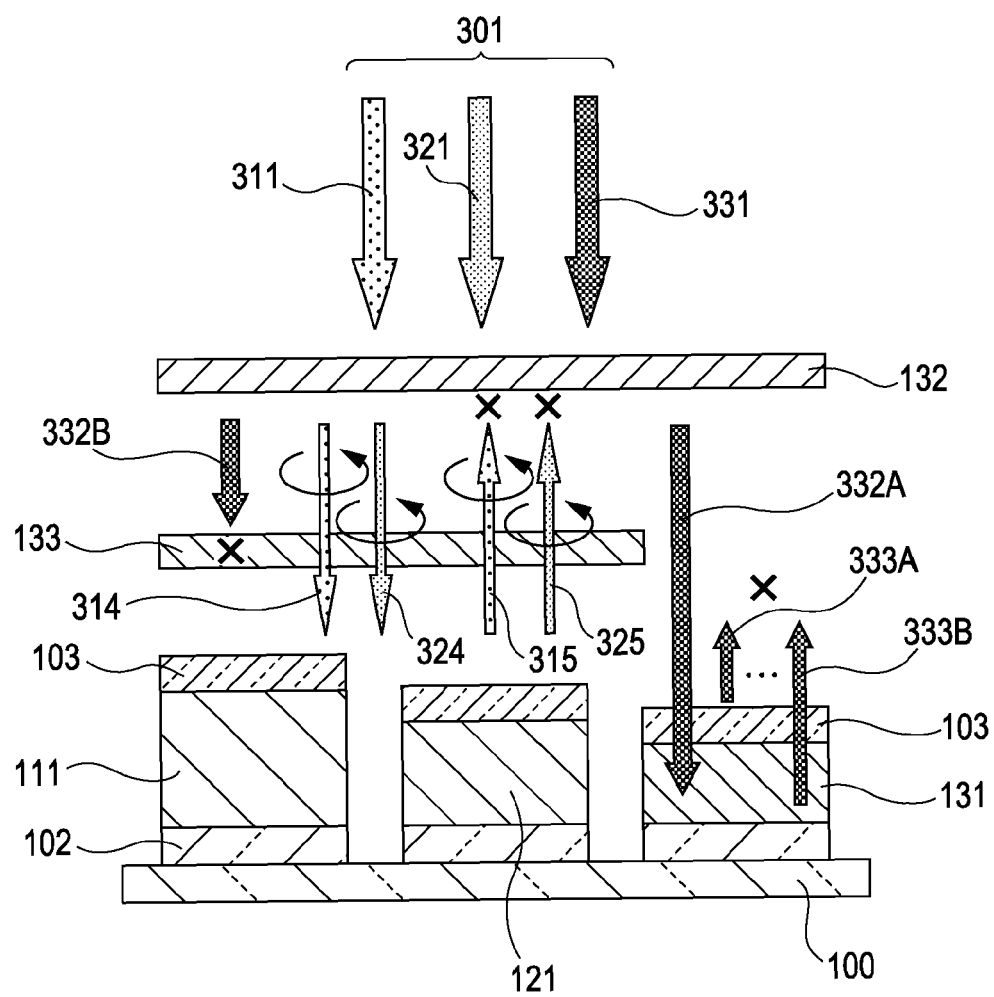
FIG. 3 is a sectional view of an organic EL display apparatus according to the present invention.

The principle of the present invention will now be described with reference to the attached drawings. FIG. 3 shows an organic EL display apparatus. The organic EL apparatus includes pixels each including three sub-pixels: a red (R), a green (G), and a blue (B) sub-pixel. In the organic EL display apparatus, the light-emitting efficiency of the B sub-pixel is prevented from being reduced and the reflection of external light is prevented.

Figure 1A:
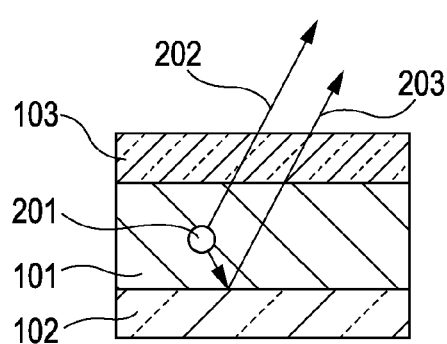
FIGS. 1A and 1B are conceptual views showing the emission of an organic EL diode and the reflection of external light.
Figure 1B:
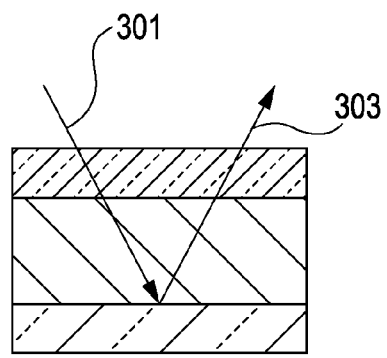
Figure 2:
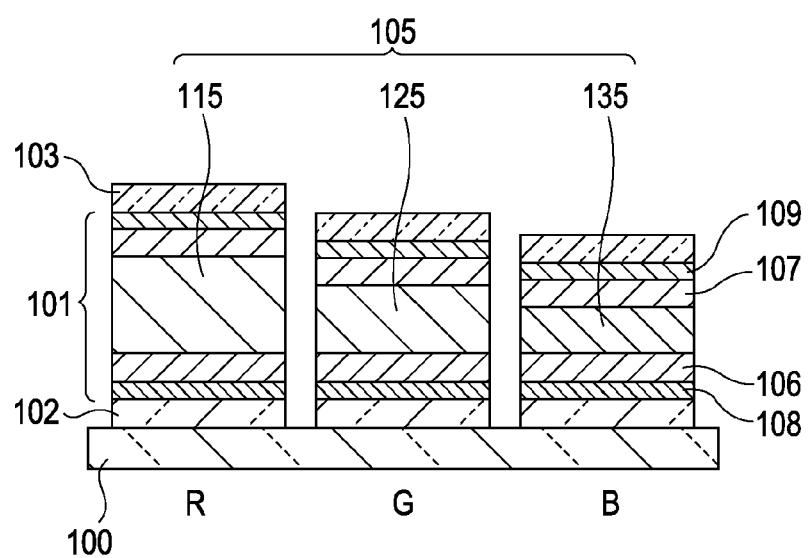
FIG. 2 is a sectional view of an organic EL diode.

The R, G, and B sub-pixels include organic EL diodes. The organic EL diodes each include a reflective electrode 102 serving as an anode, a transparent electrode 103 serving as a cathode, and an organic layer 101 sandwiched therebetween. The reflective electrode 102 and the transparent electrode 103 may be referred to as an upper and a lower electrode, respectively. The organic layers 101 are grouped into R organic layers 111, G organic layers 121, and B organic layers 131 corresponding to the R, G, and B sub-pixels, respectively. The R, G, and B organic layers 111, 121, and 131 contain a red, a green, or a blue luminescent organic compound. With reference to FIG. 2, the organic layers 101 usually each include a hole transport sub-layer 106, a light-emitting sub-layer 105, and an electron transport sub-layer 107 arranged in that order. The organic layers 101 may further each include a hole injection sub-layer 108 and an electron injection sub-layer 109 as required, the hole injection sub-layer 108 being located between the reflective electrode 102 and the hole transport sub-layer 106, the electron injection sub-layer 109 being located between the transparent electrode 103 and the electron transport sub-layer 107. The light-emitting sub-layers 105 are grouped into R light-emitting sub-layers 115, G light-emitting sub-layers 125, and B light-emitting sub-layers 135 corresponding to the R organic layers 111, the G organic layers 121, and the B organic layers 131, respectively.

Figure 4:
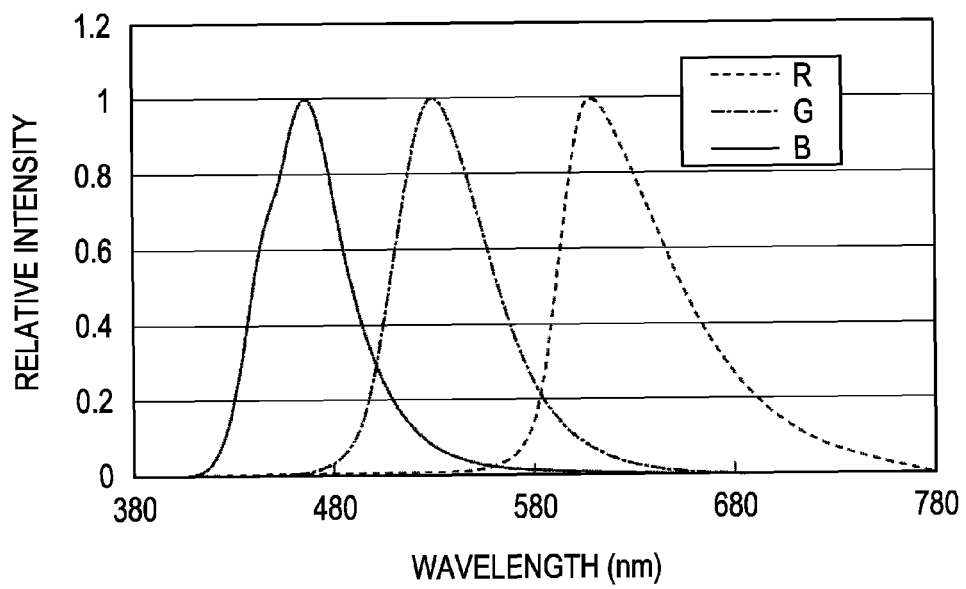
FIG. 4 is a graph showing the emission spectra of an R, a G, and a B organic EL diode.

Holes and electrons are injected into the organic layers 101 from the reflective electrodes 102 and the transparent electrodes 103, respectively, by applying voltages to the organic EL diodes and then recombined with each other, whereby R light, G light, and B light are emitted from the organic EL diodes. FIG. 4 shows the spectra of R light, G light, and B light. The side of the transparent electrodes 103 viewed from the organic layers 101 is referred to as a light extraction side. The organic layers 101 and the reflective and transparent electrodes 102 and 103 usually have thicknesses of several to several hundred nanometers. The organic EL diodes have a multilayer interference structure that causes the interference of visible light. A unit including the above members other than a circularly polarizing member is herein referred to as "display panel". An apparatus including a display panel and such a circularly polarizing member is herein referred to as "display apparatus".

In order to impart a function of preventing the reflection of external light to such a display panel to enhance the contrast thereof, a B transmissive circularly polarizing member 132 is placed on the light extraction side. The B transmissive circularly polarizing member 132 includes a B transmissive linearly polarizing portion and a λ/4 retardation film. The B transmissive circularly polarizing member 132 allows a left- or right-circularly polarized portion of an R component of visible light and that of a G component of visible light to pass therethrough and allows 50% or more of all or a portion of a B component of visible light to pass therethrough.

Optical properties of a circularly polarizing member are characterized by the spectral transmittance $T_x(\lambda)$ of x axis-polarized light and the spectral transmittance $T_y(\lambda)$ of y axis-polarized light, wherein $T_y(\lambda) \leq T_x(\lambda)$. The spectral transmittance $T(\lambda)$ of the circularly polarizing member is represented by the following equation:

$$T(\lambda)=(T_x(\lambda)+T_y(\lambda))/2 \qquad (I).$$

The spectral transmittance $T_c(\lambda)$ of a crossed Nicol prism is represented by the following equation:

$$T_c(\lambda)=T_x(\lambda) \times T_y(\lambda) \qquad (II).$$

The crossed Nicol prism includes two circularly polarizing members that are arranged such that the absorption axes thereof are perpendicular to each other.

The reflectance $R(\lambda)$ of a display apparatus including the circularly polarizing member is represented by the following equation:

$$R(\lambda)=T_c(\lambda) \times RO(\lambda) \qquad (III),$$

wherein $RO(\lambda)$ represents the spectral reflectance of a display panel. An increase in the spectral transmittance $T_c(\lambda)$ of the crossed Nicol prism increases the reflectance $R(\lambda)$ of the display apparatus. This leads to a reduction in contrast.

Comparative Examples 1 and 2 showing conventional techniques will now be described. Display panels used in Comparative Examples 1 and 2 have a spectral reflectance of 1 in the visible range.

COMPARATIVE EXAMPLE 1

A display apparatus of Comparative Example 1 includes ordinary circularly polarizing members arranged on the light extraction side of a display panel. The circularly polarizing members have a spectral transmittance of 40% in the visible range and crossed Nicol prisms configured with the circularly polarizing members have a spectral transmittance of 0%. Since the spectral transmittance of the circularly polarizing members is 40%, the display apparatus has a problem that the light-emitting efficiency thereof is less than 50%.

COMPARATIVE EXAMPLE 2

Figure 7:
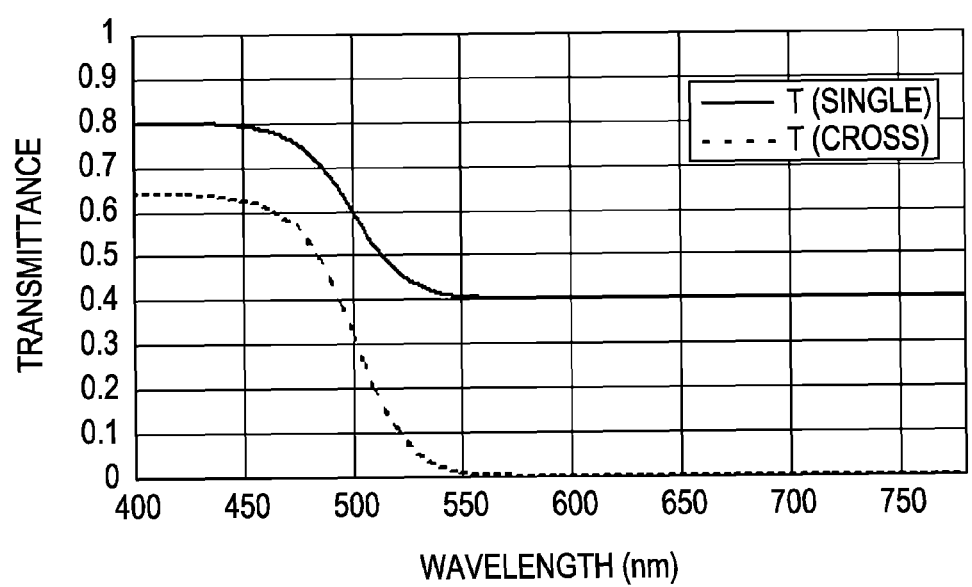
FIG. 7 is a graph showing the spectral transmittance of a B transmissive circularly polarizing member and the spectral transmittance of a crossed Nicol prism.

In order to improve the light-emitting efficiency of B organic EL diodes to solve the problem described in Comparative Example 1, a display apparatus of Comparative Example 2 includes a display panel including a B transmissive circularly polarizing member 132 as shown in FIG. 3. FIG. 7 shows the spectral transmittance $T(\lambda)$ of the B transmissive circularly polarizing member 132 as a solid line and the spectral transmittance $T_c(\lambda)$ of a crossed Nicol prism as a broken line. The B transmissive circularly polarizing member 132 has a spectral transmittance of greater than 50% at a wavelength of less than 500 nm. The crossed Nicol prism has an increased spectral transmittance at a wavelength of less than 500 nm.

As shown in FIG. 3, B light emitted from a B organic EL diode included in a B sub-pixel passes through the B transmissive circularly polarizing member 132; hence, the light-emitting efficiency of the display apparatus can be prevented from being reduced by the B transmissive circularly polarizing member 132. Since the display apparatus includes the B transmissive circularly polarizing member 132 having a spectral transmittance shown in FIG. 7, the display apparatus can emit B light with an efficiency about 1.5 times higher than that of another display apparatus including a B transmissive circularly polarizing member having a spectral transmittance of about 40% in the visible range. FIG. 4 shows the emission spectra of the display apparatus.

The ability of the B transmissive circularly polarizing member 132 to prevent the reflection of external light is inferior to that of ordinary circularly polarizing members. An R light component 311 and G light component 321 of incident light 301 have right-circularly (or left-circularly) polarized light portions, which are absorbed by the B transmissive circularly polarizing member 132. Hence, the R light component 311 and G light component 321 are converted into an R left-circularly (or right-circularly) polarized light component 314 and a G left-circularly (or right-circularly) polarized light component 324, respectively. The R left-circularly (or right-circularly) polarized light component 314 and the G left-circularly (or right-circularly) polarized light component 324 are reflected by the interfaces between a plurality of layers included in organic EL diodes an odd number of times and thereby the polarization thereof is reversed; that is, the R left-circularly (or right-circularly) polarized light component 314 and the G left-circularly (or right-circularly) polarized light component 324 are converted into an R reflected right-circularly (or left-circularly) polarized light component 315 and a G reflected right-circularly (or left-circularly) polarized light component 325, respectively. Components 315 and 325 are projected on the B transmissive circularly polarizing member 132 from the side of the organic EL diodes and are then absorbed by the B transmissive circularly polarizing member 132. The R light component 311 and the G light component 321 can be prevented from being reflected in such a manner that the B transmissive circularly polarizing member 132 is placed on the light extraction side. This leads to an increase in contrast. A B incident light component 331 of incident light 301 is reflected by a sub-pixel or an insulating layer, whereby a portion of the B incident light component 331 is transmitted to the light extraction side. Therefore, strong light is incident on the display apparatus under light conditions and therefore the contrast thereof is reduced.

Figure 5:
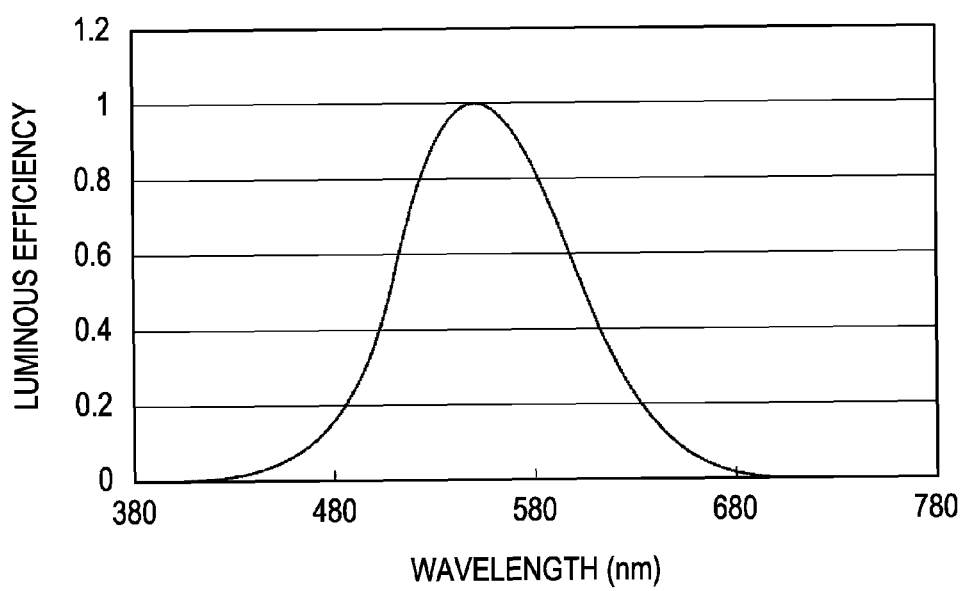
FIG. 5 is a graph showing the luminous efficiency of a display apparatus.
Figure 6:
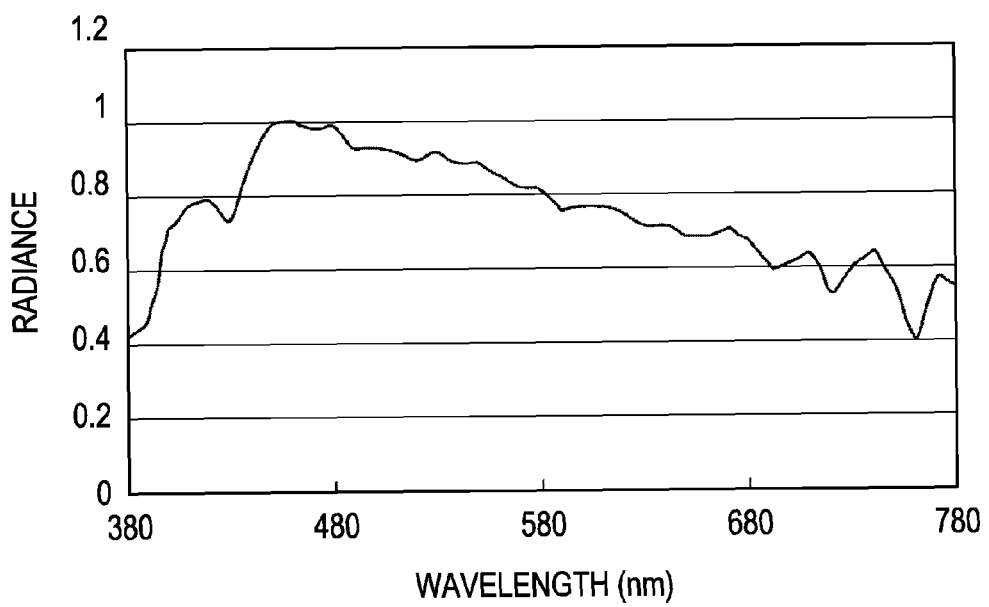
FIG. 6 is a graph showing CIE Standard Illuminant D65 relative spectral power distribution.

The ability of the display apparatus to prevent the reflection of external light can be evaluated using the luminous reflectance RV of external light. The luminous reflectance RV is defined by the following equation:

$$RV = \frac{\int_{380}^{780} V(\lambda)R(\lambda)S(\lambda)}{\int_{380}^{780} V(\lambda)S(\lambda)} \qquad (V)$$

wherein $V(\lambda)$ represents the luminous efficiency of the display apparatus that depends on the wavelength $\lambda$ of incident light, $S(\lambda)$ represents the relative spectral distribution of incident light, and $R(\lambda)$ represents the spectral reflectance of the display apparatus. FIG. 5 shows the luminous efficiency $V(\lambda)$ of the display apparatus. FIG. 6 shows CIE Standard Illuminant D65 relative spectral power distribution, which is an example of the relative spectral distribution $S(\lambda)$ of incident light.

Most small-sized displays are installed in mobile apparatuses and therefore are mainly used outdoors. The illuminance of ambient light is about 15,000 lx under cloudy or shady conditions. Since the displays are installed in such mobile apparatuses and therefore need to operate at low power, the maximum brightness of the displays is about 500 cd/m$^2$. Since the minimum contrast ratio required to identify characters is about five, the displays preferably have a luminous reflectance of about 2.6% or less. The display apparatus of Comparative Example 2 has a luminous reflectance of 7.0% as shown in Table 1 and therefore is unsuitable for outdoor use.

In consideration that spectral properties of circularly polarizing members are adjusted in such a manner that $T_x(\lambda)$ is fixed to $T_x$ and $T_y(\lambda)$ is varied, the following equation is obtained from Equations I and II:

$$T(\lambda) = \frac{1}{2}\left[T_x + \frac{T_c(\lambda)}{T_x}\right] \quad \text{(VI)}$$

As is clear from Equation VI, in order to increase the spectral transmittance $T(\lambda)$ of the circularly polarizing members, the spectral transmittance $T_c(\lambda)$ of a crossed Nicol prism needs to be increased. In general, the enhancement of light-emitting efficiency is incompatible with the prevention of the reflection of external light.

In the present invention, in order to enhance the ability of a display apparatus to prevent the reflection of external light without varying the light-emitting efficiency of B organic EL diodes, the spectral reflectance $R_o(\lambda)$ of a display panel is varied because the spectral reflectance $R_o(\lambda)$ thereof does not correlate to spectral properties of circularly polarizing members.

Figure 8:
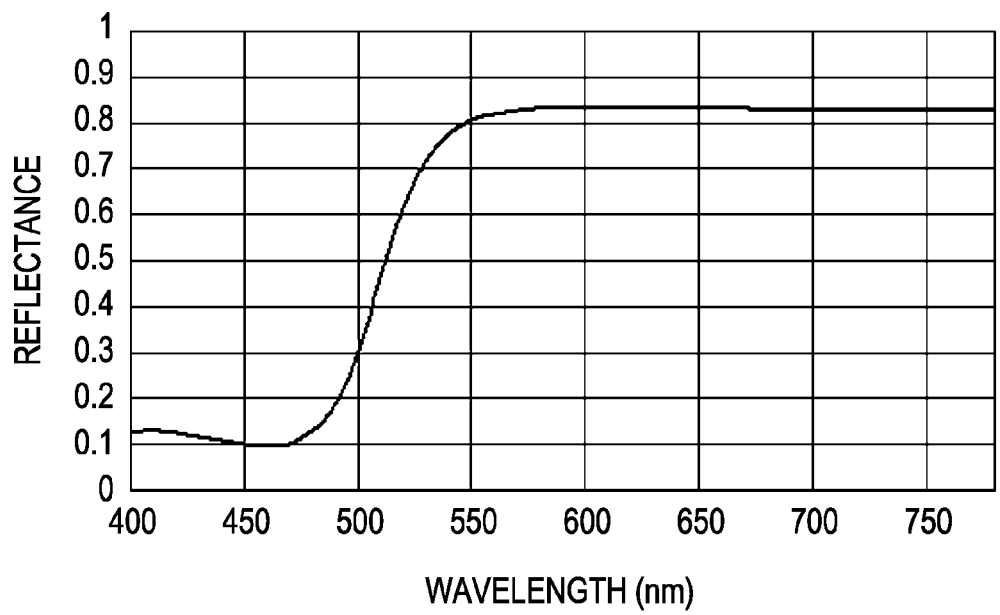
FIG. 8 is a graph showing the spectral reflectance of a display panel, including no circularly polarizing member, for forming Structure 2.
Figure 9:
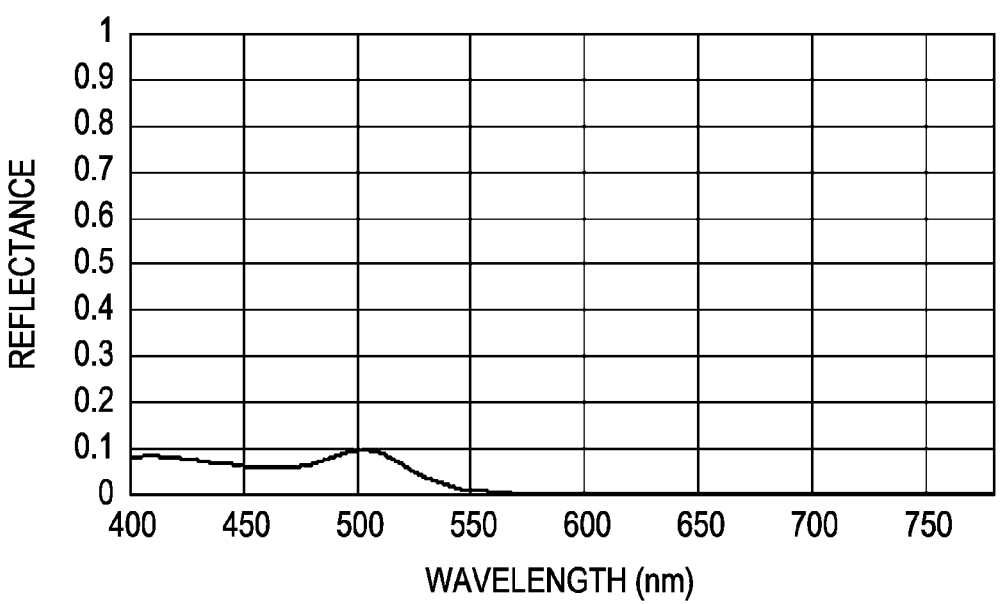
FIG. 9 is a graph showing the spectral reflectance of a display apparatus, or Structure 2, including a circularly polarizing member.

As is clear from Equation III, the spectral reflectance $R(\lambda)$ of the display apparatus is defined as the product of the spectral transmittance $T_c(\lambda)$ of a crossed Nicol prism including B transmissive circularly polarizing members 132 and the spectral reflectance $R_o(\lambda)$ of the display panel. As shown in FIG. 7, the crossed Nicol prism has a large spectral reflectance at B wavelengths. In contrast, the display panel has a small spectral reflectance at B wavelengths as shown in FIG. 8. This allows the display apparatus to have a small spectral reflectance as shown in FIG. 9. That is, the display apparatus has a reduced luminous reflectance and an increased contrast ratio.

In particular, two types of elements below are additionally used.

Structure 1

Figure 10:
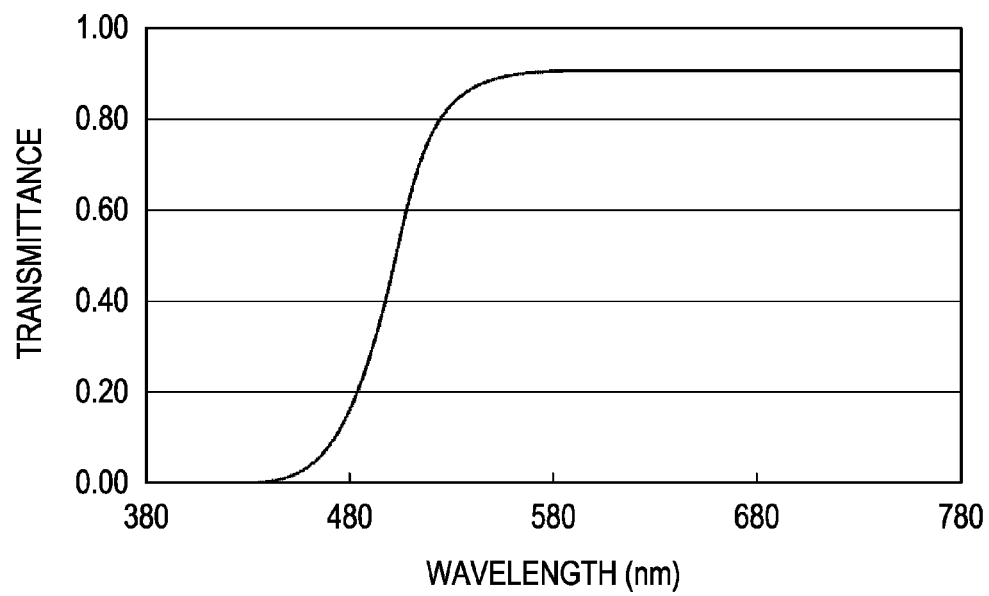
FIG. 10 is a graph showing the spectral transmittance of a B-absorbing layer.
Figure 17:
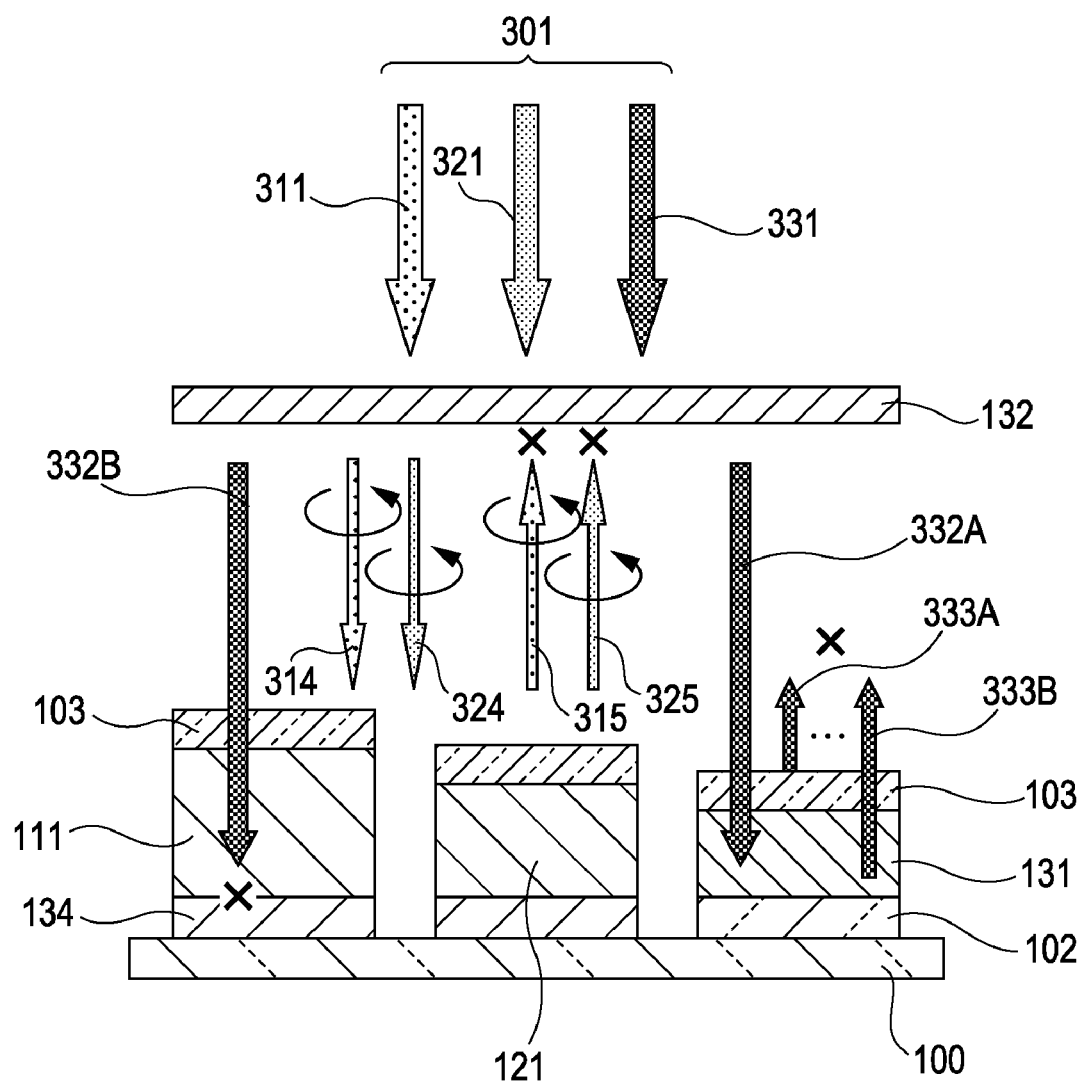
FIG. 17 is a sectional view of an organic EL display apparatus according to a third embodiment of the present invention.

A B-absorbing layer 133 that is a first element is placed above a region of a pixel other than a light-emitting region of a B organic EL diode included in a B sub-pixel as shown in FIG. 3 such that the B-absorbing layer 133 is located on the light extraction side of the pixel. The B-absorbing layer 133 may be a Y color filter. A structure including the above components is referred to as Structure 1. FIG. 10 shows the spectral transmittance of the B-absorbing layer 133. Alternatively, as shown in FIG. 17, B low-reflection electrodes which are made of gold (Au) or copper (Cu) and which slightly reflect B light may be used instead of the B-absorbing layer 133. The B low-reflection electrodes are arranged in R and G organic EL diodes included in R and G sub-pixels. The B low-reflection electrodes may include multilayer interference films which include metal layers and transparent electrode layers and which slightly reflect B light. The B low-reflection electrodes preferably have a minimum reflectance of less than 50% at B wavelengths. This allows the B-absorbing layer 133 to absorb a first B transmitted light portion 332B of a B incident light component 331 to prevent the reflection of B light, the first B transmitted light portion 332B being applied to a region other than a light-emitting region of the B sub-pixel. As shown in Table 1, Structure 1 has a luminous reflectance of about 2.7%. That is, the presence of the first element allows Structure 1 to have a luminous reflectance that is about 60% less than that of the display apparatus of Comparative Example 2 and to have increased light-emitting efficiency.

Structure 2

Figure 11:
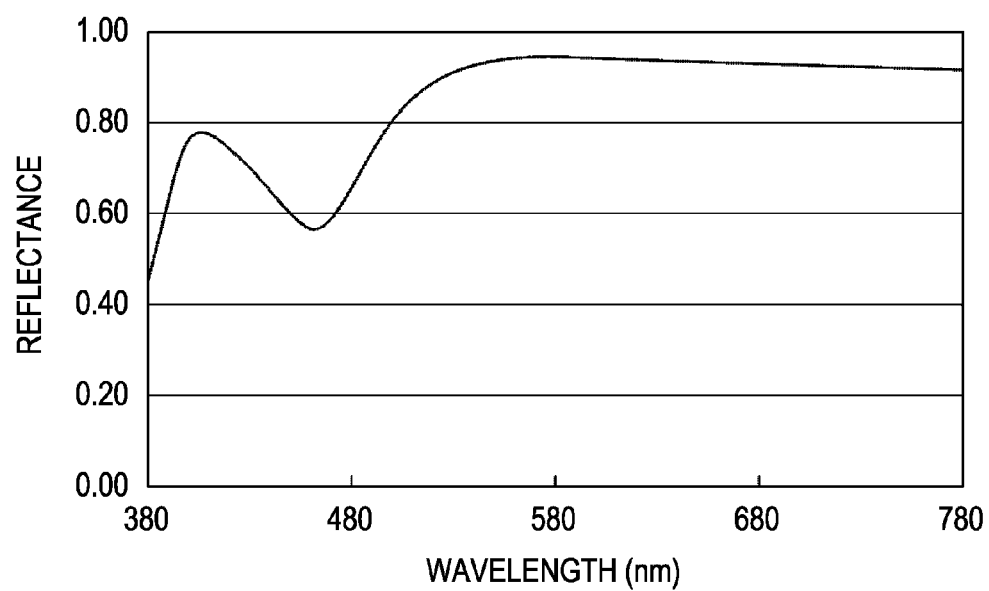
FIG. 11 is a graph showing the spectral reflectance of a B multilayer interference film.
Figure 12:
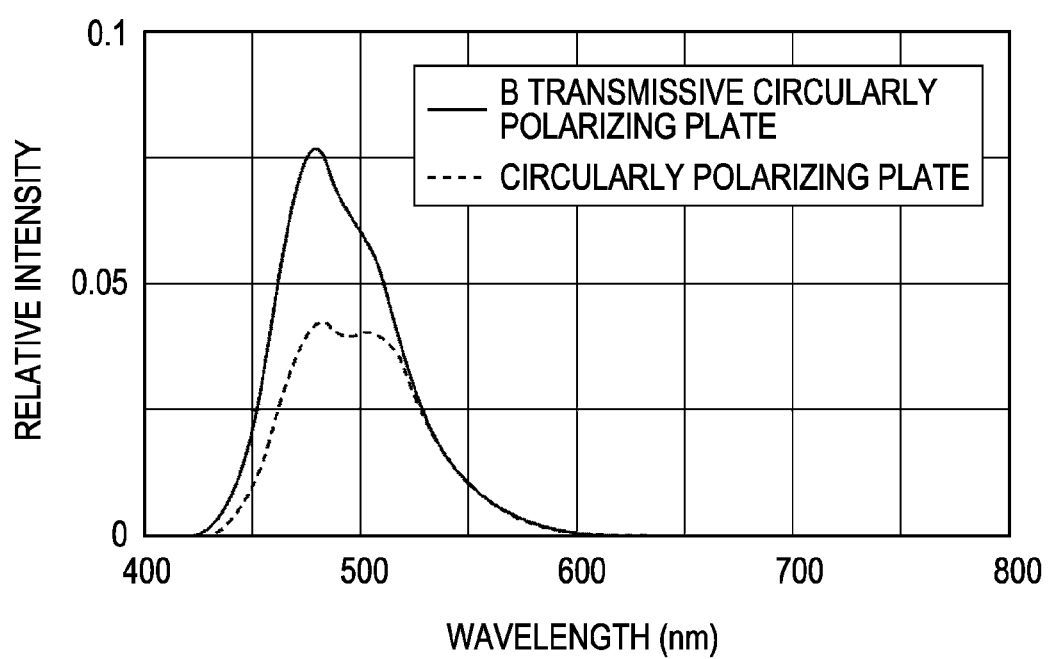
FIG. 12 is a graph showing the emission spectrum of a display apparatus including a B transmissive circularly polarizing member and the emission spectrum of a display apparatus including no B transmissive circularly polarizing member.

A multilayer interference film that is a second element is placed in a B organic EL diode. The spectral reflectance of the multilayer interference film has a global or local minimum at B wavelengths. FIG. 11 shows the spectral reflectance of the multilayer interference film, which is formed by depositing a lower electrode including an Ag alloy portion with a thickness of 200 nm and an indium zinc oxide (IZO) portion with a thickness of 20 nm, an organic layer with a thickness of 80 nm, and an IZO upper electrode with a thickness of 60 nm on a glass substrate in that order. The multilayer interference film serve as a resonator which has a resonant frequency corresponding to the wavelength of B light and in which light is reflected by a face of the Ag alloy portion that is directed to the glass substrate and is reflected by the interface between the IZO upper electrode and air present on an organic EL diode. In this configuration, a first reflecting plane located at a position closer to the lower electrode than the organic layer is the face of the Ag alloy portion that is directed to the glass substrate and a second reflecting plane located at a position closer to the upper electrode than the organic layer is the interface between the IZO upper electrode and air present on the organic EL diode. Alternatively, the resonator may include a translucent metal electrode instead of a transparent electrode 103 so as to have a resonant frequency corresponding to a peak wavelength in the spectrum of B light. In this configuration, a second reflecting plane located at a position closer to the upper electrode than the organic layer is the interface between the translucent metal electrode and the organic layer in contact with the translucent metal electrode.

In the resonator, conditions for increasing the interference in the resonator usually agree substantially with conditions for reducing the interference between reflected light components. Since the resonant frequency of the resonator corresponds to the resonant wavelength of B light, the light-emitting efficiency of a B organic EL diode can be increased by the increase in interference and the reflection of external light can also be prevented by reducing interference on the B organic EL diode. The term "increase" means to increase the intensity of light emitted from the organic layer by amplifying a light component traveling from the organic layer to the light extraction side and another light component traveling from the organic layer to a reflective electrode. The term "reduction in reflected light" means to reduce the intensity of external light which is incident on a light-emitting diode and which travels out of the light-emitting diodes by attenuating an external light component reflected by a first reflecting plane and an external light component reflected by a second reflecting plane.

Resonance conditions are given by the following equation:

$$\frac{2nd}{\lambda} + \frac{\phi 1 + \phi 2}{2\pi} = m \quad \text{(VII)}$$

wherein $\lambda$ represents the wavelength of emitted light, n represents the refractive index of a resonator, d represents the length of the resonator, $\phi 1$ represents the phase shift at a reflecting plane located on the substrate side, $\phi 2$ represents the phase shift at a reflecting plane located on the light extraction side, and m represents an integer.

With reference to FIG. 11, the spectral reflectance has a local minimum at a wavelength of about 460 nm. This shows that the film thickness is sufficient to reduce the reflectance at a peak wavelength of 465 nm in the B light spectrum shown in FIG. 4. A structure including the above components is referred to as Structure 2.

As shown in FIG. 3, a second B-transmitted light portion 332A of the B incident light component 331 that is incident on a light-emitting region of the B sub-pixel interferes with a first B reflected light portion 333A and second B reflected light portion 333B reflected by an interface present in the multi-layer interference film of the B organic EL diode having a multilayer interference structure and therefore the second B-transmitted light portion 332A and the first and second B reflected light portion 333A and 333B are attenuated. This prevents the reflection of the B incident light component 331. As shown in Table 1, Structure 2 has a luminous reflectance of about 2.4%. That is, the presence of the second element allows Structure 2 to have a luminous reflectance that is about 10% less than that of Structure 1 and to have increased light-emitting efficiency.

Table 1 shows the luminous reflectance of Structure 1, Structure 2, and the display apparatus of Comparative Example 2. Structure 1, Structure 2, and the display apparatus of Comparative Example 2 were evaluated on the basis that the spectral transmittance of each B transmissive circularly polarizing member was as represented by a solid line in FIG. 7, the spectral transmittance of each crossed Nicol prism was as represented by a broken line in FIG. 7, and the aperture ratio was 50%. A light component, having a reflectance of about 4%, reflected by the interface between the B transmissive circularly polarizing member and air was neglected because the B transmissive circularly polarizing member has an antireflection (AR) coating. FIG. 8 shows the spectral reflectance of a display panel, including no circularly polarizing member, for forming Structure 2. FIG. 9 shows the spectral reflectance of Structure 2 including a circularly polarizing member.

TABLE 1

|  | First element (B-absorbing layer) | Second element (Multilayer interference film) | Spectral reflectance |
| --- | --- | --- | --- |
| Structure 1 | Present | Absent | 2.65% |
| Structure 2 | Present | Present | 2.37% |
| Comparative Example 2 | Absent | Absent | 7.00% |

In order to emit B light with increased efficiency, the B-transmissive circularly polarizing member has a higher spectral transmittance at B wavelengths less than or equal to 500 nm as compared to that at wavelengths other than the B wavelengths shown as the solid line in FIG. 7. This allows a crossed Nicol prism including the B circularly polarizing member to have a higher spectral transmittance at the B wavelengths shown as the broken line in FIG. 7. The display panel of Structure 2 has a lower spectral transmittance at the B wavelengths as shown in FIG. 8. Structure 2 has a lower spectral transmittance at visible wavelengths as shown in FIG. 9.

Therefore, if a circularly polarizing member in which the reflectance of light of a selected color is greater than that of light of another color is provided in a display panel in which the transmittance of light of a selected color is greater than that of light of another color, a high-contrast display apparatus having high efficiency can be achieved.

Structure 1 including the first element and Structure 2 including the first and second elements are described above. The first and second elements may be used alone or in combination. Even a structure including the first element alone can prevent B incident light from being reflected by a B organic EL diode and therefore is effective in solving the above problems.

In order to reduce the power consumption of a display apparatus, it is effective to use a circularly polarizing member having an increased spectral transmittance at a wavelength corresponding to the color of light that is emitted with the lowest efficiency. The power consumption of Structure 2 is compared to that of the display apparatus of Comparative Example 1. In Structure 2 and the display apparatus of Comparative Example 1, the R, G, and B organic EL diodes included in the sub-pixels have the spectra shown in FIG. 4 and also have a light-emitting efficiency of 21.6, 19.8, and 2.3 cd/A, respectively. The display apparatus has an aperture ratio of 50% and is driven with a voltage of about 10 V. The contrast ratio, driving current density, and power consumption of the display apparatus are values obtained by emitting white light (CIEx=0.32 and CIEy=0.33) with a luminance of 100 cd/cm$^2$.

Table 2 shows the CIE chromaticity, light-emitting efficiency, contrast ratio, driving current density, and power consumption of the display apparatus of Comparative Example 1. Among the R, G, and B sub-pixels, the B sub-pixel has the lowest light-emitting efficiency and the highest driving current density.

TABLE 2

| | | | | White light (CIEx = 0.32, CIEy = 0.33, and a luminance of 100 cd/cm$^2$) | | |
| --- | --- | --- | --- | --- | --- | --- |
| sub-pixel | CIEx | CIEy | Light-emitting efficiency (cd/A) | Contrast ratio (%) | Driving current density (mA/cm$^2$) | Power consumption (mW) |
| R | 0.65 | 0.348 | 8.6 | 29.40% | 2.0 | 682.7 |
| G | 0.28 | 0.665 | 7.92 | 56.90% | 4.3 | |
| B | 0.136 | 0.103 | 0.92 | 13.70 | 8.9 | |

Table 3 shows the CIE chromaticity, light-emitting efficiency, contrast ratio, driving current density, and power consumption of Structure 2. The use of the B transmissive circularly polarizing member allows the B sub-pixel of Structure 2 to have a light-emitting efficiency about 1.5 times greater than that of the B sub-pixel of Comparative Example 1 and to have better chromaticity and a lower contrast ratio as compared to the B sub-pixel of Comparative Example 1. The display apparatus of Comparative Example 1 has a power consumption of 682.7 mW and Structure 2 has a power consumption of 538.8 mw. That is, the power consumption of Structure 2 is about 20% less than that of the display apparatus of Comparative Example 1. The driving current density of the B sub-pixel of Structure 2 is less than that of the B sub-pixel of Comparative Example 1. This reduces differences in driving current density between the R, G, and B sub-pixels of Structure 2. For most of organic EL diodes, a reduction in driving current density leads to an increase in half-decay lifetime. When the half-decay lifetime of the B sub-pixel of Structure 2 is the shortest, differences in half-decay lifetime between the R, G, and B sub-pixels of Structure 2 can be reduced because a reduction in driving current density increases the half-decay lifetime of the B sub-pixel. The above description of Structure 2 can be applied to Structure 1.

TABLE 3

| sub-pixel | CIEx | CIEy | Light-emitting efficiency (cd/A) | Contrast ratio (%) | White light (CIEx = 0.32, CIEy = 0.33, and a luminance of 100 cd/cm²) Driving current density (mA/cm²) | Power consumption (mW) |
|---|---|---|---|---|---|---|
| R | 0.651 | 0.349 | 7.8 | 28.60% | 2.2 | 538.8 |
| G | 0.29 | 0.67 | 7.0 | 60.50% | 5.2 | |
| B | 0.136 | 0.083 | 1.4 | 10.90% | 4.7 | |

A black matrix may be used such that portions of the black matrix are disposed between pixels or regions other than light-emitting regions of the pixels.

In view of productivity and manufacturing cost, it is preferable that color filters and circularly polarizing members are not used in combination to form structures. Such structures are described below.

Figure 13:
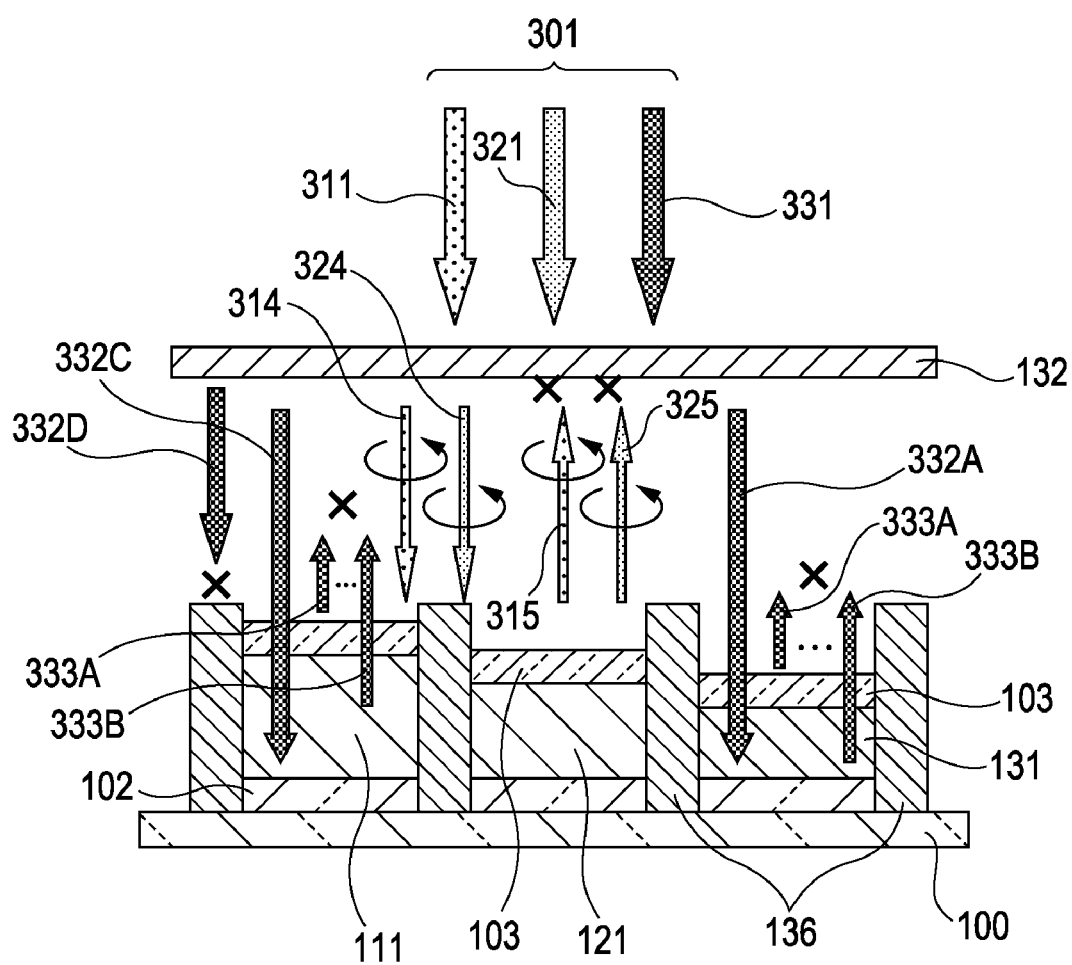
FIG. 13 is a sectional view of an organic EL display apparatus according to a second embodiment of the present invention.

As shown in FIG. 13, a B transmissive circularly polarizing member 132 is placed on the light extraction side of an organic EL diode. The spectral transmittance T(λ) of the B transmissive circularly polarizing member 132, as well as that of Comparative Example 2, is as shown as the solid line in FIG. 7 and the spectral reflectance R(λ) of a crossed Nicol prism including the B transmissive circularly polarizing member 132 is as shown as the broken line in FIG. 7.

Figure 14:
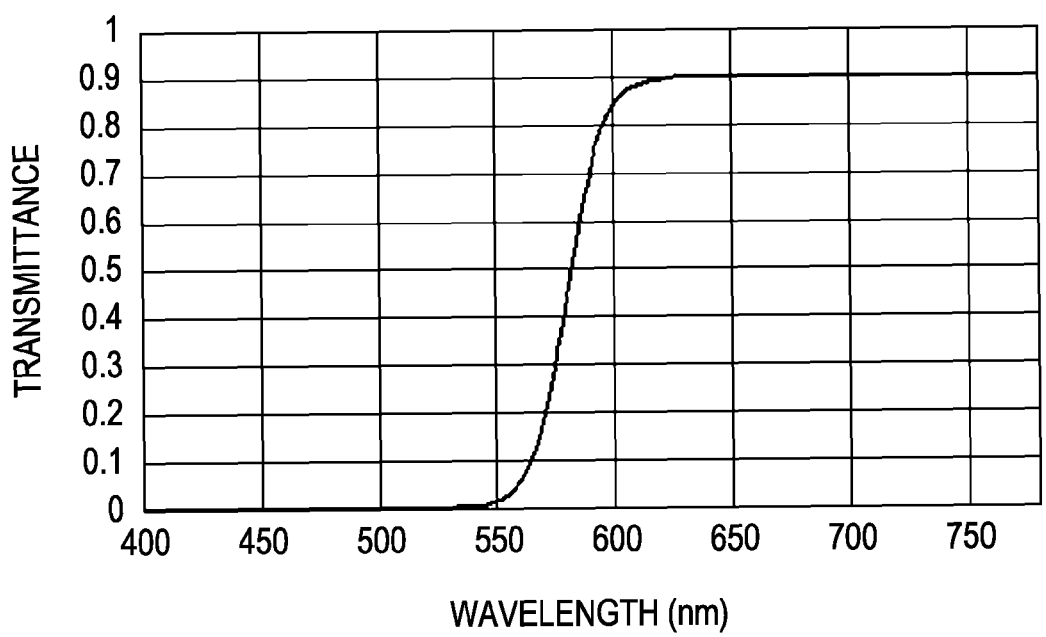
FIG. 14 is a graph showing the spectral transmittance of a B-absorbing isolation layer.

B-absorbing isolation layers 136 are arranged in non-emission regions between sub-pixels. FIG. 14 shows the spectral transmittance of the B-absorbing isolation layers 136 that are brown. The B-absorbing isolation layers 136 prevent the reflection of a third B-transmitted light portion 332D. A structure including the above components is referred to as Structure 3. With reference to Table 4, Structure 3 has a luminous reflectance of about 3.5%. That is, the luminous reflectance of Structure 3 is 50% less than that of the display apparatus of Comparative Example 2. Furthermore, Structure 3 has increased light-emitting efficiency.

The B-absorbing isolation layers 136 are arranged in the non-emission regions and therefore may be colored yellow, orange, red, or black. The B-absorbing isolation layers 136 have only to prevent the reflection of B incident light and therefore may have a multilayer interference structure. A planarization layer disposed between the B-absorbing isolation layers 136 and thin-film transistors (TFTs) may be colored yellow, orange, red, or black.

Figure 15:
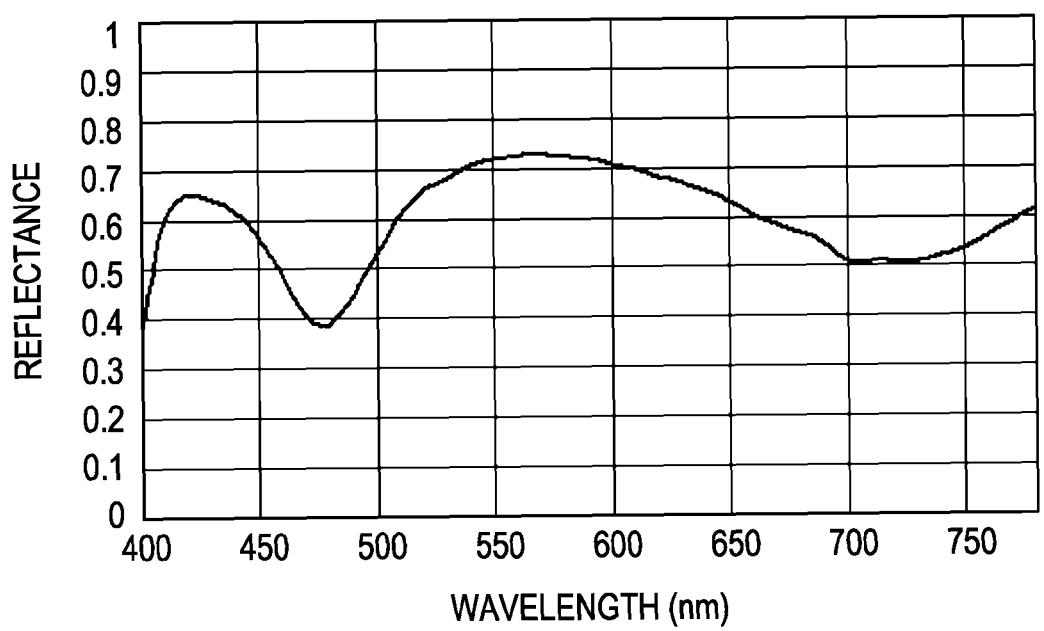
FIG. 15 is a graph showing the spectral reflectance of a B resonator.

A structure including a B resonator and the same components as those of Structure 3 is referred to as Structure 4. In Structure 4, a face of a B organic EL diode that is directed to a substrate serves as a high-reflective metal face (a first reflecting plane) and a face of the B organic EL diode that is located on the light extraction side serves as a reflective face (a second reflecting plane) located at the interface between a transparent electrode and air. The optical path length from a light-emitting site to a reflective electrode (the first reflecting plane) is set to about 3λB/4 and the optical path length from the light-emitting site to the air-transparent electrode interface (the second reflecting plane) is set to about λB/2. Hence, the optical distance between the first and second reflecting planes is equal to 5λB/4. FIG. 15 shows the spectral reflectance of the B resonator. From resonant conditions, the spectral reflectance thereof has a local minimum in the wavelength range from 450 to 500 nm and reflected light is yellow, which is the complementary color of blue. The reduction in interference due to the B resonator prevents the reflection of a second B transmitted light portion 332A. With reference to Table 4, Structure 4 has a luminous reflectance of about 3.0%. That is, the luminous reflectance of Structure 4 is about 15% less than that of Structure 3. Structure 4 has increased light extraction efficiency.

Figure 16:
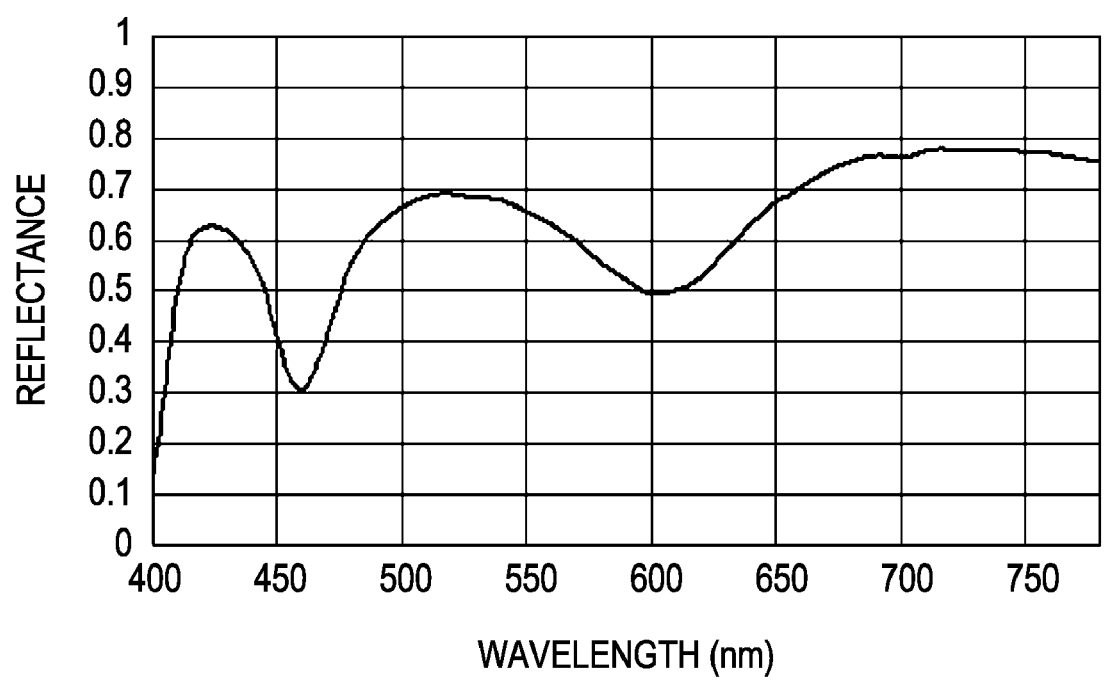
FIG. 16 is a graph showing the spectral reflectance of an R resonator.

A structure including an R resonator and the same components as those of Structure 4 is referred to as Structure 5. In Structure 5, a face of a B or R organic EL diode that is directed to a substrate serves as a high-reflective metal face (a first reflecting plane) and a face of the B or R organic EL diode that is located on the light extraction side serves as a reflective face (a second reflecting plane) located at the interface between a transparent electrode and air. In the B organic EL diode, the optical distance between the first and second reflecting plane is equal to about 5λB/4. In the R organic EL diode, the optical distance between the first and second reflecting plane is equal to about 5λB/4. FIG. 16 shows the spectral reflectance of the R resonator. The optical path length of R light is equal to about 5λB/4 and that of B is equal to about 7λB/4. The spectral reflectance thereof has a local minimum at a wavelength of about 600 nm and another local minimum at a wavelength of about 460 nm. A fourth B-transmitted light portion 332C can be prevented from being reflected. With respect to Table 4, Structure 5 has a luminous reflectance of about 2.5%. That is, the luminous reflectance of Structure 5 is about 15% less than that of Structure 4.

TABLE 4

| | B-absorbing isolation layers | B resonator | R resonator | Spectral reflectance |
|---|---|---|---|---|
| Structure 3 | Present | Absent | Absent | 3.50% |
| Structure 4 | Present | Present | Absent | 2.96% |
| Structure 5 | Present | Present | Present | 2.50% |
| Comparative Example 2 | Absent | Absent | Absent | 7.00% |

The power consumption of Structure 5 is about 467.8 mW when Structure 5 emits white light (CIEx=0.32 and CIEy=0.33) with a luminance of 100 cd/cm². The power consumption of a structure including an ordinary circularly polarizing member with a transmittance of about 40% is about 680 mW. That is, the power consumption of Structure 5 is about 30% less than that of this structure.

Organic compounds used for the following sub-layers are not particularly limited and may be low-molecular-weight materials or polymers: the hole transport sub-layers 106, light-emitting sub-layers 105, electron transport sub-layers 107, hole injection sub-layers 108, and electron injection sub-layer 109 shown in FIG. 2. Inorganic compounds may be contained in these layers as required.

Examples of these compounds are as described below.

Hole-transporting materials preferably have high mobility such that holes can be readily injected from anodes and then transported to light-emitting layers. Examples of hole-transporting materials with low or high molecular weight include, but are not limited to, triarylamine derivatives, phenylenediamine derivatives, triazole derivatives, oxadiazole derivatives, imidazole derivatives, pyrazoline derivatives, pyrazolone derivatives, oxazole derivatives, fluorenone derivatives, hydrazone derivatives, stilbene derivatives, phthalocyanine derivatives, porphyrin derivatives, and conducting polymers such as polyvinylcarbazole, polysilylene, and polythiophene. Examples of a hole-transporting material with low molecular weight are as follows:

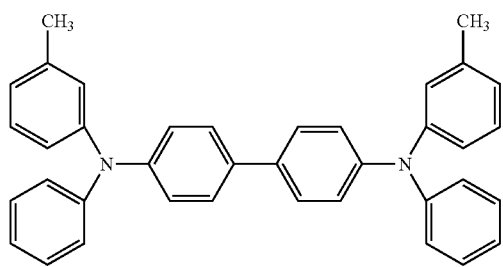
TPD
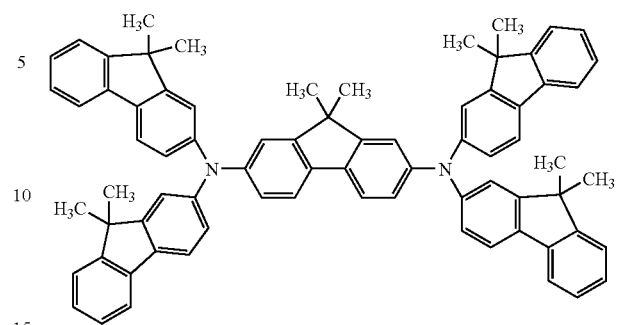
TFLFL
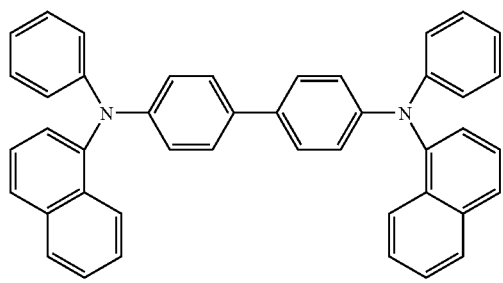
α-NPD
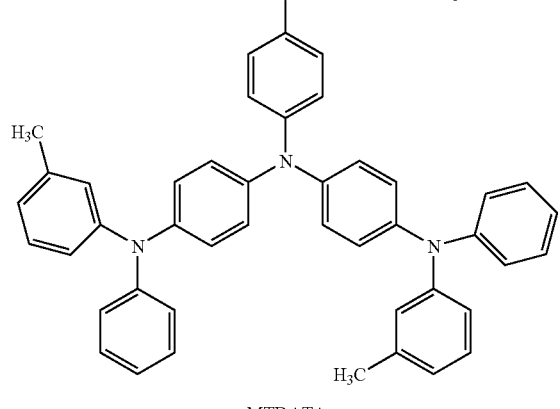
m-MTDATA
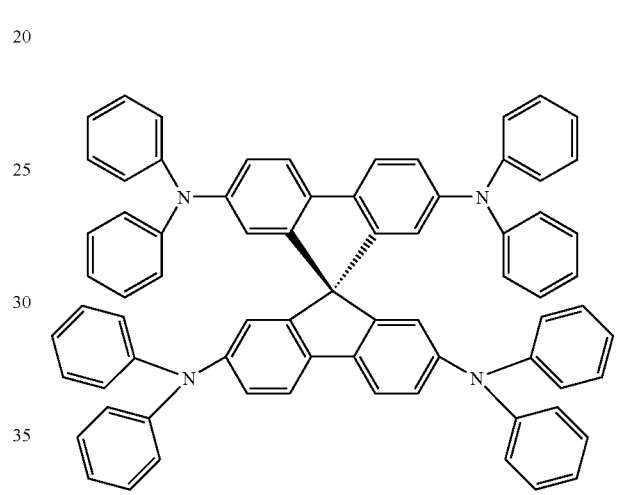
spiro-TPD
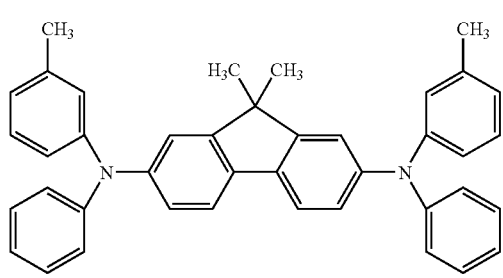
DTDPFL
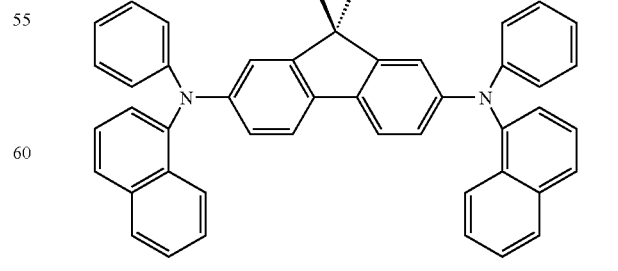
spiro-NPD

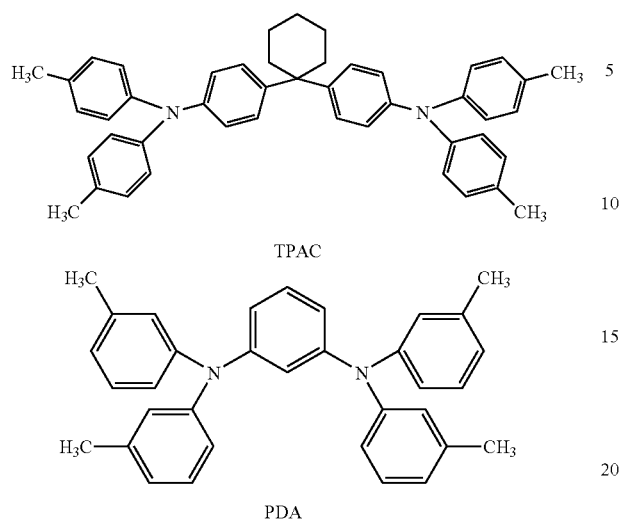
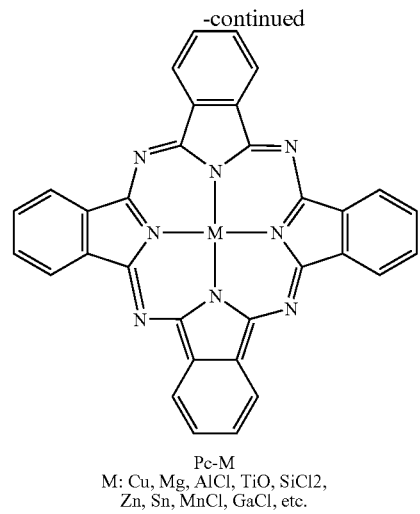
Examples of a hole-transporting material with high molecular weight are as follows:
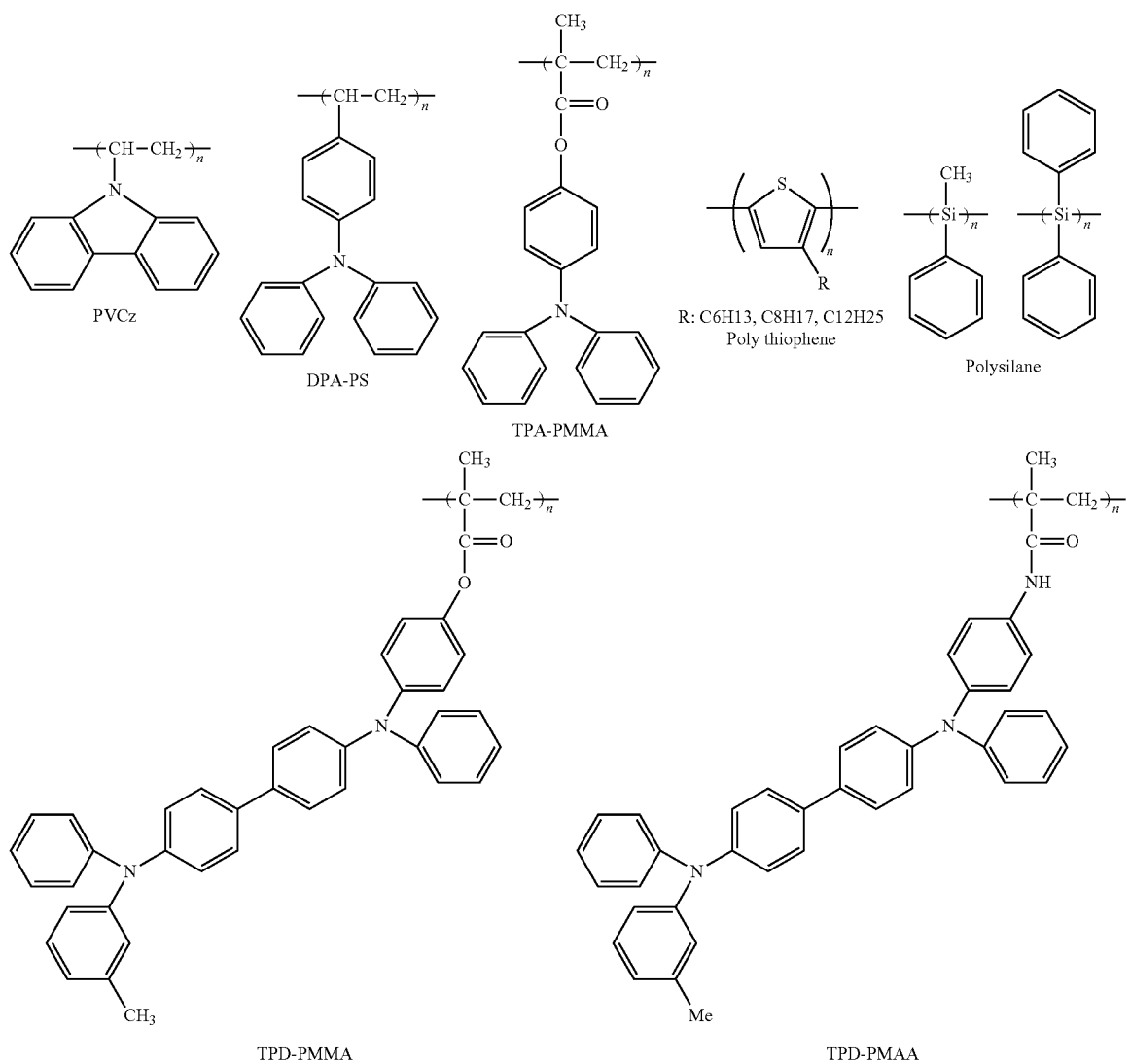

-continued

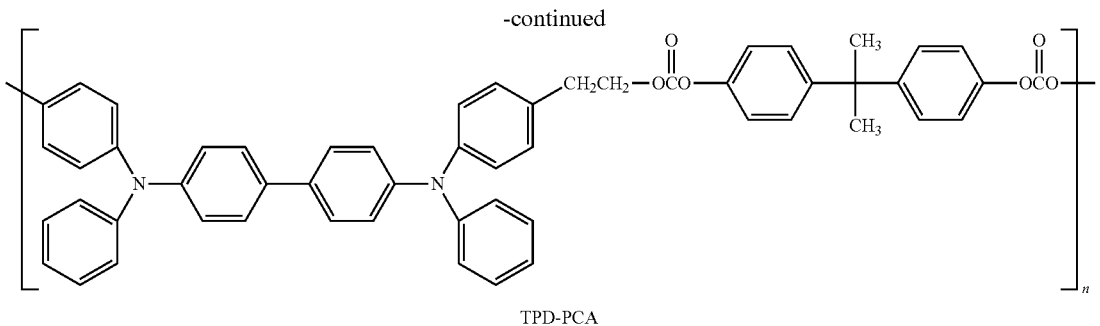

TPD-PCA

Examples of a luminescent material include fluorescent dyes and phosphorescent materials having high light-emitting efficiency and are as follows:

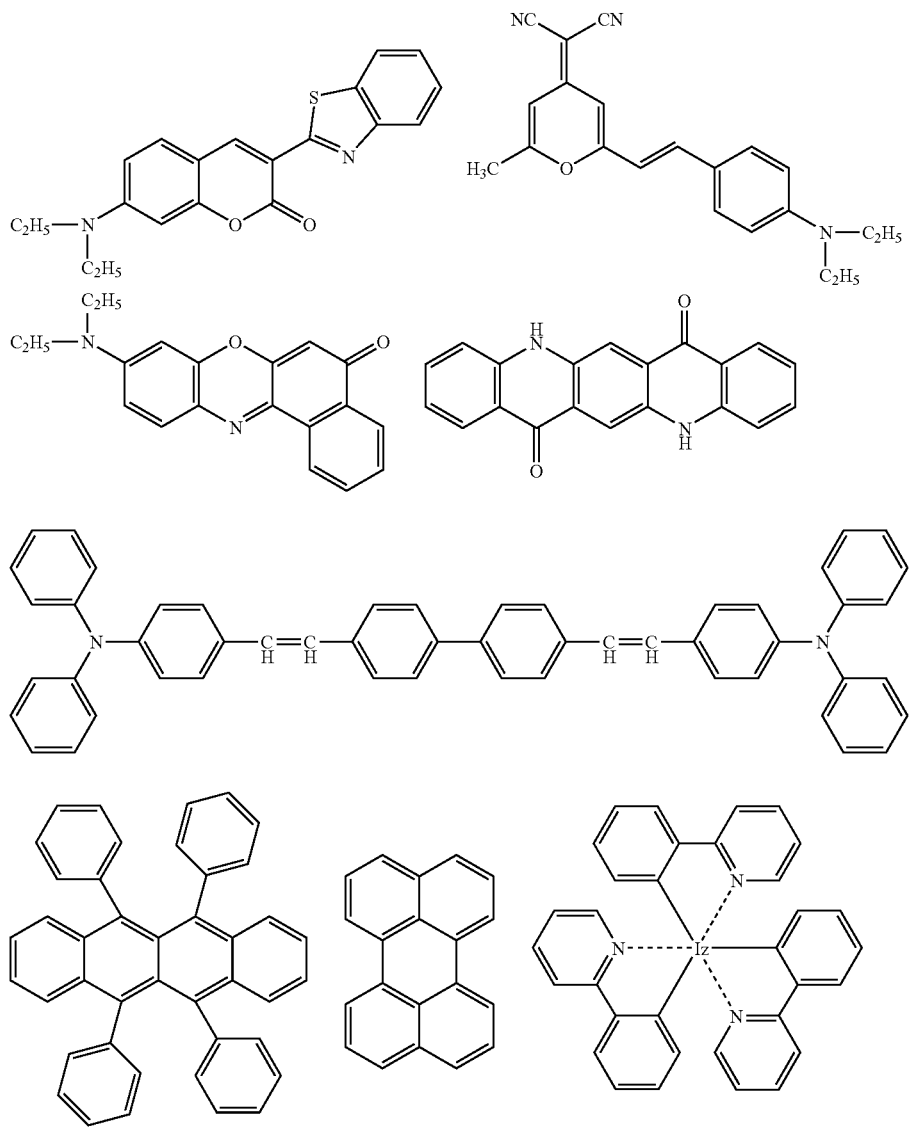

An electron-transporting material is selected from materials having an ability to transport injected electrons to light-emitting layers in consideration of the carrier mobility of the hole-transporting material. Examples of the electron-transporting material include, but are not limited to, oxadiazole derivatives, oxazole derivatives, thiazole derivatives, thiadiazole derivatives, pyrazine derivatives, triazole derivatives, triazine derivatives, perylene derivatives, quinoline derivatives, quinoxaline derivatives, fluorenone derivatives, anthrone derivatives, phenanthroline derivatives, and organometallic complexes. Particular examples of the electron-transporting material are as follows:

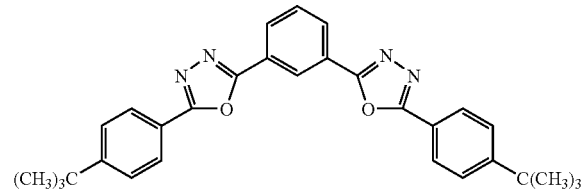

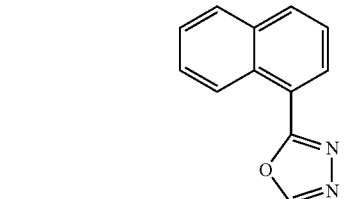

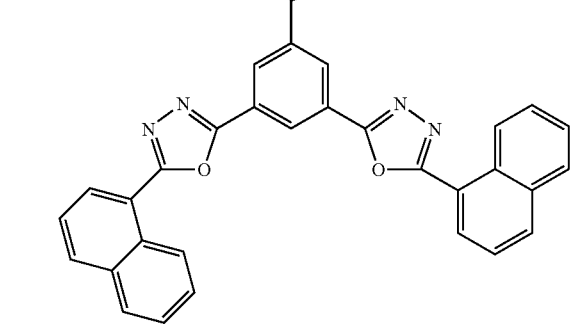

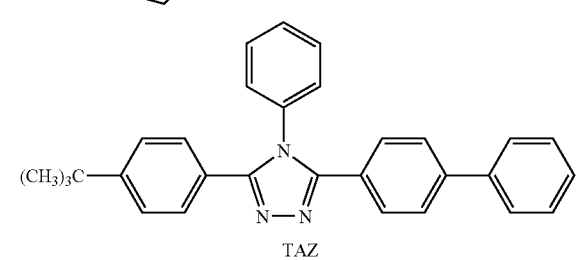

TAZ

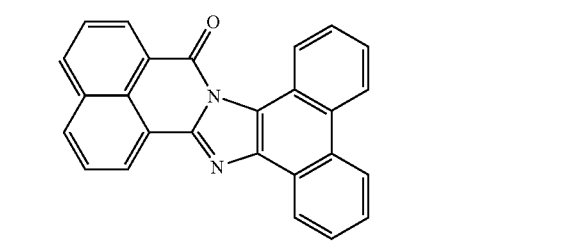

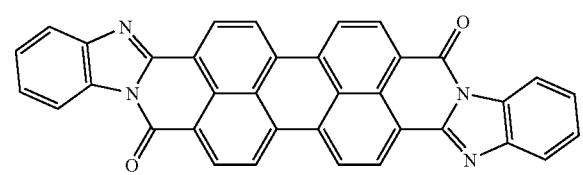

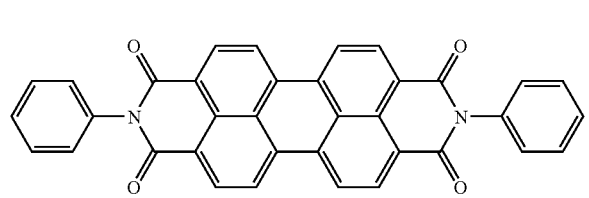

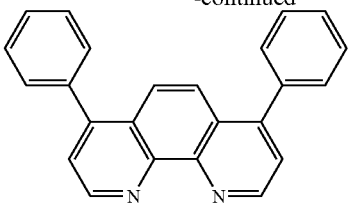

Bphen

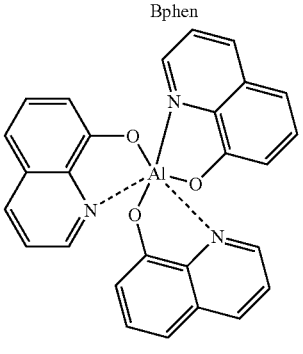

Alq3

Examples of a hole-injecting material include transition metal oxides such as $MoO_3$, $WO_3$, and $V_2O_5$; copper phthalocyanine; and other compounds.

An electron-injecting material can be prepared by adding 0.1 to thirty percent of an alkali metal, an alkaline earth metal, or a compound of such a metal, to the electron-transporting material. The electron injection sub-layers 109 are not essential, but are preferably present. In order to achieve good electron-injecting properties, the electron injection sub-layers 109 preferably have a thickness of about 10 to 100 nm in consideration of the damage caused by forming the reflective electrodes 102.

Layers containing one of the organic compounds according to the present invention are usually formed by a vacuum vapor deposition process; an ionization vapor deposition process; a sputtering process; a plasma coating process; or a known coating process, such as a spin-coating process, a dipping process, a casting process, a Langmuir-Blodgett (BL) process, or an inkjet process, using an appropriate solvent to form a thin layer. In particular, the coating process is preferably used in combination with an appropriate binder resin. The binder resin can be selected from various binders. Examples of the binder resin include, but are not limited to, polyvinylcarbazoles, polycarbonates, polyesters, polyarylates, polystyrenes, acrylonitrile-butadiene-styrene (ABS) resins, polybutadienes, polyurethanes, acrylic resins, methacrylic resins, butyral resins, polyvinyl acetals, polyamides, polyimides, polyethylenes, polyethersulfones, diallyl phthalate resins, phenol resins, epoxy resins, silicone resins, polysulfone resins, and urea resins. These polymers and resins may be used alone or in combination or used in combination with a known additive such as a plasticizer, an oxidation inhibitor, or an ultraviolet absorber, as required.

The transparent electrodes 103 may include conducting oxide films made of ITO or IZO. A material for forming the transparent electrodes 103 is preferably selected such that good electron-injecting properties can be achieved when the transparent electrodes 103 are used in combination with the electron transport sub-layers 107 and the electron injection sub-layers 109. The transparent electrodes 103 can be formed by sputtering.

In order to prevent contact with oxygen or moisture, a protective layer may be used as required. The protective layer may be made of a metal nitride such as silicon nitride or silicon nitride oxide; a metal oxide such as tantalum oxide; diamond; a polymer such as a fluorocarbon resin, polyparaxylene, polyethylene, a silicone resin, or polystyrene; or a photocurable resin. The diodes may be covered with glass, metal, or a gas impermeable film or packaged with an appropriate sealing resin. In order to enhance moisture resistance, the protective layer may include a moisture barrier.

Examples of B transmissive circularly polarizing members are as described below. Linearly polarizing members widely used are usually prepared in such a manner that polyvinyl alcohol (PVA) is mixed with iodine or a dichroic dye and the mixture is oriented and then applied to both faces of each triacetylcellulose film. Oriented iodine complexes exhibit strong dichroism and have different absorption peaks depending on the number of polyiodine molecules contained in the complexes. The absorption spectra of the linearly polarizing members can be adjusted by controlling the ratio of the amount of an $I_3^-$—PVA complex having an absorption peak at a wavelength of about 480 nm to the amount of an $I_5^-$—PVA complex having an absorption peak at a wavelength of about 600 nm. A reduction in the amount of the $I_3^-$—PVA complex provides a B transmissive linearly polarizing member. A reduction in the amount of the $I_5^-$—PVA complex provides an R transmissive linearly polarizing member. In the case where the dichroic dye is used, a B transmissive circularly polarizing member, an R transmissive circularly polarizing member, or a G transmissive linearly polarizing member can be prepared by controlling the mixing ratio of the dichroic dye to PVA, the content of the dichroic dye, and the thickness of a layer of the dichroic dye.

The following member may be used as a B transmissive linearly polarizing member: a two-dimensional photonic crystal-type linearly polarizing member in which high-refractive index materials and low-refractive index materials are alternately arranged in a triangular pattern. For the two-dimensional photonic crystal-type linearly polarizing member, polarizing wavelengths and transmissive wavelengths can be controlled by varying the thickness and/or refractive index of layers. Therefore, the two-dimensional photonic crystal-type linearly polarizing member can be used as an R or G transmissive linearly polarizing member.

A B, R, or G transmissive circularly polarizing member can be assembled from a λ/4 retardation film and a linearly polarizing member that allows light of a specific color to pass therethrough.

The transmittance of light of a selected one of different colors through a circularly polarizing member according to the present invention is higher than that of light of the other colors therethrough. For the three primary colors, the transmittance of any one of R light, G light, and B light through the circularly polarizing member may be higher than the transmittance of the other lights or the transmittances of any two of R light, G light, and B light through the circularly polarizing member may be higher than the transmittance of the remaining light. The circularly polarizing member does not have high transmittance at every wavelength.

The anodes and the cathodes are located on the substrate side and the light extraction side, respectively, as described above. The anodes and the cathodes may be located on the light extraction side and the substrate side, respectively. In this case, the hole transport sub-layers, the light-emitting sub-layers, and the electron injection sub-layers are arranged in the order opposite to that described above. Therefore, a display apparatus according to the present invention is not limited to a configuration in which anodes and cathodes are located on the substrate side and the light extraction side, respectively.

A display apparatus according to the present invention may have a bottom emission structure in which a transparent electrode is disposed above a transparent substrate and an organic layer and reflective electrode are deposited on the organic layer.

Sub-pixels may have the same area or different areas. In particular, light-emitting regions of the sub-pixels may have the same area or different areas.

A display apparatus according to the present invention may have a multi-photon or multilayer structure in which a plurality of organic EL diodes are arranged.

A display apparatus according to the present invention may include pixels each including four sub-pixels, that is; (i) an R, a G, a B, and a cyan (C) sub-pixel, (ii) B monochromatic pixels, or (iii) pixels including another type of sub-pixel instead of pixels each including the three sub-pixels, R, G, and B sub-pixels. A display apparatus according to the present invention is not limited to a configuration in which each pixel include three sub-pixels, that is; an R, a G, and a B sub-pixel.

A display apparatus according to the present invention includes B sub-pixels having high light-emitting efficiency and may include sub-pixels that emit light of another color with light efficiency.

The present invention is not limited to a display apparatus including organic EL diodes and can be applied display apparatuses including inorganic EL diodes, quantum-dot EL diodes, or inorganic light-emitting diodes; plasma displays; and other display apparatuses.

EMBODIMENTS

Embodiments of the present invention will now be described. The present invention is not limited to the embodiments.

First Embodiment

A full-color organic EL display apparatus having a configuration shown in FIG. 3 is manufactured by a method as described below.

A circuit for driving low-temperature polysilicon TFTs is formed above a glass base plate serving as a support and a planarization layer made of an acrylic resin is formed on the circuit, whereby a substrate is prepared. A layer of an Ag alloy (Ag—Pd—Cu) that is reflective is formed on the substrate by a sputtering process so as to have a thickness of about 100 nm and then patterned. An IZO layer for forming transparent conducting films is formed on the Ag alloy layer by a sputtering process so as to have a thickness of about 20 nm and then patterned, whereby reflective electrodes 102 are formed. Isolation layers made of an acrylic resin are formed between the reflective electrodes 102, whereby an anode-bearing substrate is prepared. The anode-bearing substrate is ultrasonically cleaned with isopropyl alcohol (IPA), subjected to boiling cleaning, and then dried. The resulting anode-bearing substrate is subjected to UV-ozone cleaning and organic compounds are then deposited on the reflective electrodes 102 by vacuum vapor deposition.

Compound I, represented by the following formula, forms hole transport layers and is deposited on the reflective electrodes 102 using a shadow mask:

(I)

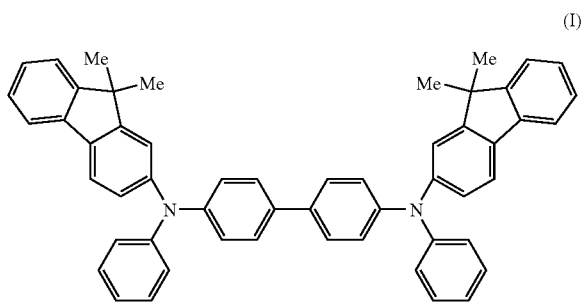

This technique provides R hole transport layers having a thickness of about 50 nm, G hole transport layers having a thickness of about 30 nm, and B hole transport layers having a thickness of about 20 nm. In this operation, the degree of vacuum is about $1\times10^{-4}$ Pa and the rate of deposition is about 0.2 nm/s.

R, G, and B light-emitting layers are formed on the R, G, and B hole transport layers, respectively, using a shadow mask. In particular, the R light-emitting layers are formed by co-depositing Alq3 serving as a host and the luminescent compound 4-(dicyanomethylene)-2-methyl-6-(p-dimethylaminostyryl)-4H-pyran (hereinafter referred to as DCM) so as to have a thickness of about 60 nm. The weight ratio of Alq3 to DCM is about 99:1. The G light-emitting layers are formed by co-depositing Alq3 and the luminescent compound Coumarin 6 so as to have a thickness of about 40 nm. The weight ratio of Alq3 to Coumarin 6 is about 99:1. The B light-emitting layers are formed by co-depositing Compound II which serves as a host and which is represented by the following Formula II and Compound III which is luminescent and which is represented by the following Formula III so as to have a thickness of about 20 nm:

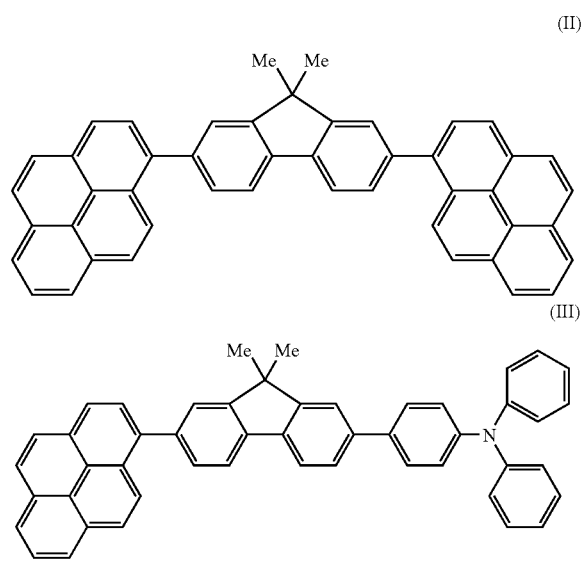

The weight ratio of Compound II to Compound III is about 80:20. In this operation, the degree of vacuum is about $1\times10^{-4}$ Pa and the rate of deposition is about 0.2 nm/s.

Bathophenanthroline (hereinafter referred to as Bphen) is deposited on the R, G, and B light-emitting layers by vacuum vapor deposition, whereby electron transport layers having a thickness of about 10 nm are formed. In this operation, the degree of vacuum is about $1\times10^{-4}$ Pa and the rate of deposition is about 0.2 nm/s. Bphen and $Cs_2CO_3$ are then co-deposited on the electron transport layers by vacuum vapor deposition, whereby electron injection layers having a thickness of about 20 nm are formed. The weight ratio of Bphen to $Cs_2CO_3$ is about 90:10. In this operation, the degree of vacuum is about $3\times10^{-4}$ Pa and the rate of deposition is about 0.2 nm/s.

The substrate including the electron injection layers is moved into a sputtering system without breaking vacuum and transparent electrodes 103 made of ITO are then formed on the electron injection layers so as to have a thickness of about 60 nm. Protective layers made of silicon nitride are formed on the transparent electrodes 103 in a thickness of about 700 nm.

A B-absorbing layer 133 serving as a yellow (Y) color filter is provided above the protective layers with an epoxy resin disposed therebetween. The B-absorbing layer 133 contains an isoindolinone yellow pigment and has removed portions corresponding to light-emitting regions of B sub-pixels, the removed portions being formed by etching. Finally, a B transmissive circularly polarizing member 132 is provided above the B-absorbing layer 133 with an adhesive disposed therebetween, whereby the display apparatus is obtained.

Second Embodiment

A display apparatus having a configuration shown in FIG. 13 is manufactured as described below. A circuit for driving low-temperature polysilicon TFTs is formed above a glass base plate serving as a support and a planarization layer made of an acrylic resin is formed on the circuit, whereby a substrate is prepared. A layer of an Ag alloy that is reflective is formed on the substrate by a sputtering process so as to have a thickness of about 100 nm and then patterned. An ITO layer for forming transparent conducting films is formed on the Ag alloy by a sputtering process so as to have a thickness of about 80 nm and then patterned, whereby reflective electrodes 102 are formed. Isolation layers made of an acrylic resin containing a red pigment are formed between the reflective electrodes 102 and then patterned, whereby an anode-bearing substrate including B-absorbing isolation layers 136 (non-emission regions) is prepared. The anode-bearing substrate is ultrasonically cleaned with isopropyl alcohol (IPA), subjected to boiling cleaning, and then dried. The resulting anode-bearing substrate is subjected to UV-ozone cleaning and organic compounds are then deposited on the reflective electrodes 102 by vacuum vapor deposition.

Compound I for forming hole transport layers is deposited on the reflective electrodes 102 using a shadow mask, whereby the following layers are prepared: R hole transport layers having a thickness of about 160 nm, G hole transport layers having a thickness of about 130 nm, and B R hole transport layers having a thickness of about 70 nm. In this operation, the degree of vacuum is about $1\times10^{-4}$ Pa and the rate of deposition is about 0.2 nm/s.

R, G, and B light-emitting layers are formed on the R, G, and B hole transport layers, respectively, using a shadow mask. In particular, the R light-emitting layers are formed by co-depositing Alq3 serving as a host and DCM so as to have a thickness of about 50 nm. The weight ratio of Alq3 to DCM is about 99:1. The G R light-emitting layers are formed by co-depositing Alq3 and Coumarin 6 so as to have a thickness of about 40 nm. The weight ratio of Alq3 to Coumarin 6 is about 99:1. The B light-emitting layers are formed by co-depositing Compound II serving as a host and Compound III so as to have a thickness of about 35 nm. The weight ratio of Compound II to Compound III is about 80:20. In this operation, the degree of vacuum is about $1\times10^{-4}$ Pa and the rate of deposition is about 0.2 nm/s.

Bphen is deposited on the R, G, and B light-emitting layers by vacuum vapor deposition, whereby electron transport layers having a thickness of about 10 nm are formed. In this operation, the degree of vacuum is about $1\times10^{-4}$ Pa and the rate of deposition is about 0.2 nm/s. Bphen and $Cs_2CO_3$ are then co-deposited on the electron transport layers by vacuum vapor deposition, whereby electron injection layers having a thickness of about 30 nm are formed. The weight ratio of Bphen to $Cs_2CO_3$ is about 90:10. In this operation, the degree of vacuum is about $3\times10^{-4}$ Pa and the rate of deposition is about 0.2 nm/s.

The substrate including the electron injection layers is moved into a sputtering system without breaking vacuum and transparent electrodes 103 made of ITO are then formed on the electron injection layers so as to have a thickness of about 60 nm. A moisture absorbent is provided around a panel and the panel is sealed with an etched glass cap, whereby the display apparatus is obtained.

Third Embodiment

A display apparatus having a configuration shown in FIG. 17 is manufactured as described below. Steps prior to a step of forming protective layers are substantially the same as those described in the first embodiment except that B low-reflective electrodes 134 are used instead of reflective electrodes for R or G sub-pixels. The B low-reflective electrodes 134 are made of Au and have a thickness of about 100 nm.

A B transmissive circularly polarizing member 132, which is used instead of a B-absorbing layer 133 serving as a Y color filter, is provided above the protective layers with an adhesive disposed therebetween.

As shown in FIG. 17, the B transmissive circularly polarizing member 132 prevents the reflection of a B transmitted light portion 332B of a B incident light component 331, the B transmitted light portion 332B being incident on an R or G sub-pixel other than a B light-emitting region.

Fourth Embodiment

Figure 18:
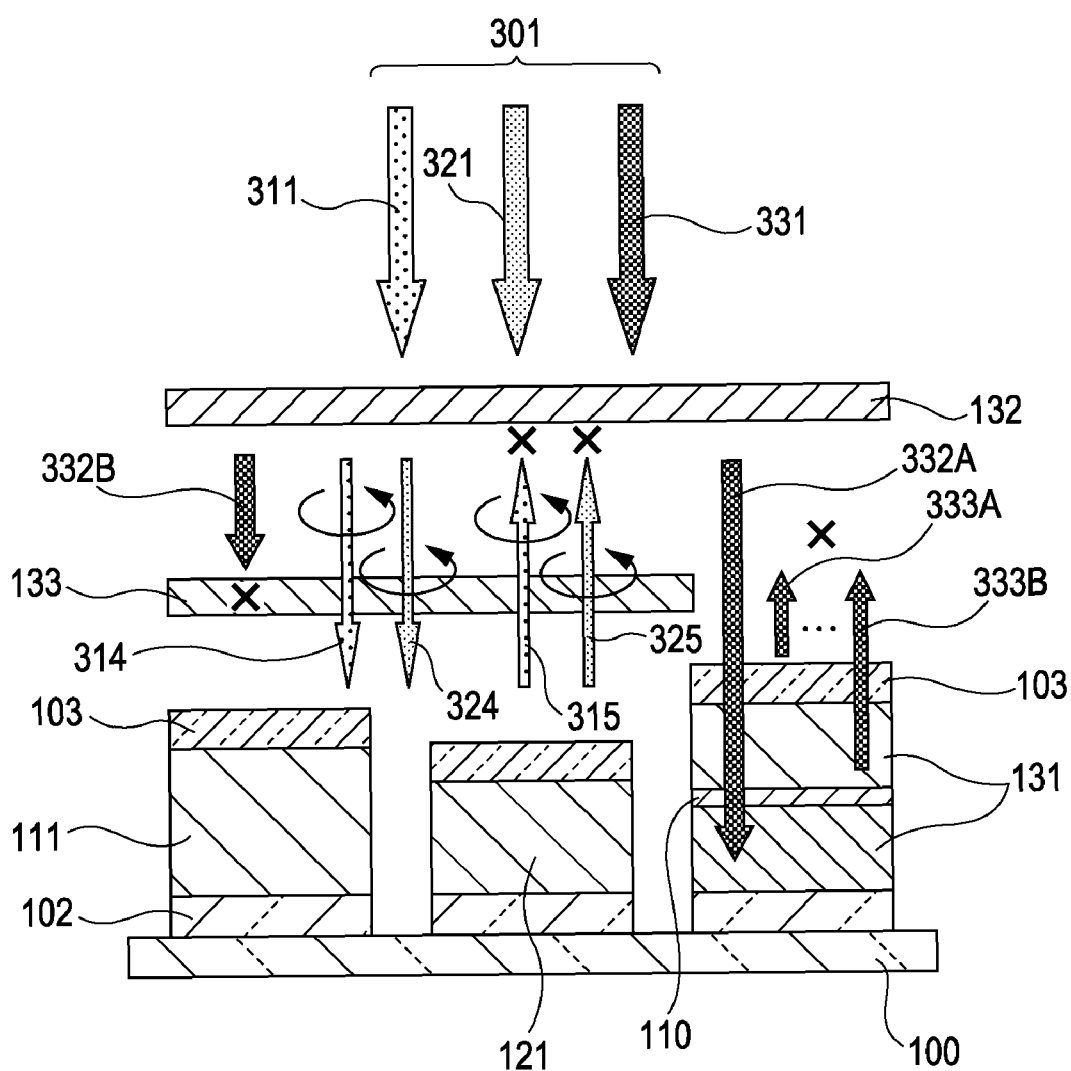
FIG. 18 is a sectional view of an organic EL display apparatus according to a fourth embodiment of the present invention.

A display apparatus having a configuration shown in FIG. 18 is manufactured as described below. The configuration of this display apparatus is substantially the same as that of the display apparatus of the first embodiment except that this display apparatus includes B organic EL diodes having a multilayer structure.

The B organic EL diodes are prepared as described below. After organic layers including electron injection sub-layers and other sub-layers are deposited on reflective electrodes 102 in the same manner as that described in the first embodiment, hole injection sub-layers are formed on the electron injection sub-layers in a thickness of several nanometers. Each electron injection sub-layer and hole injection sub-layer form a charge-generating layer 110. The following layers and electrodes are formed on the hole injection sub-layers in this order: hole transport layers, B light-emitting layers, electron transport layers, electron injection layers, and transparent electrodes 103.

Fifth Embodiment

Figure 19:
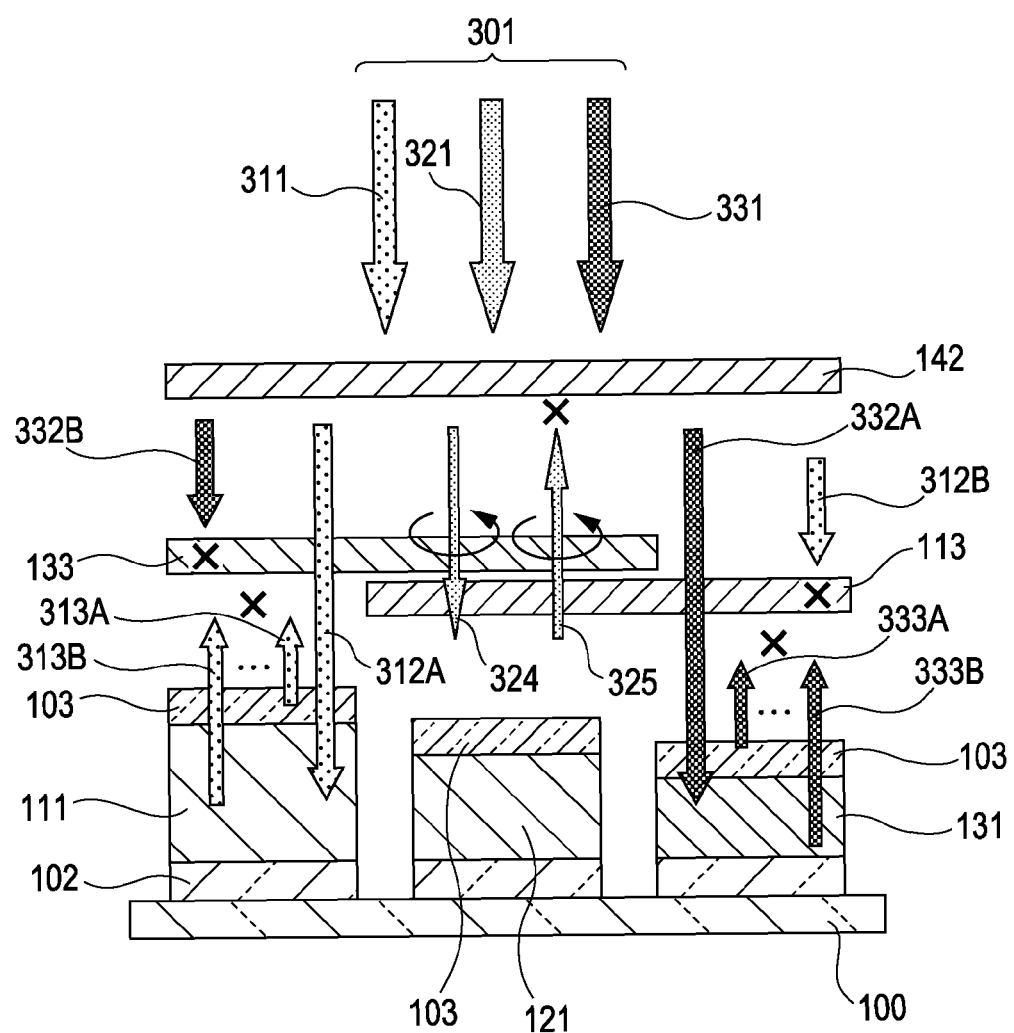
FIG. 19 is a sectional view of an organic EL display apparatus according to a fifth embodiment of the present invention.

A display apparatus having a configuration shown in FIG. 19 is manufactured as described below. Steps prior to a step of forming protective layers are substantially the same as those described in the first embodiment.

An R-absorbing layer 113 serving as a cyan (C) color filter is provided above the protective layers. The R-absorbing layer 113 has removed portions corresponding to light-emitting regions of R sub-pixels, the removed portions being formed by etching. A B-absorbing layer 133 serving as a Y color filter is provided above the R-absorbing layer 113. The B-absorbing layer 133 has removed portions corresponding to light-emitting regions of B sub-pixels, the removed portions being formed by etching. Alternatively, an RGB color filter having a black matrix may be used instead of the R-and B-absorbing layers 113 and 133.

Figure 20:
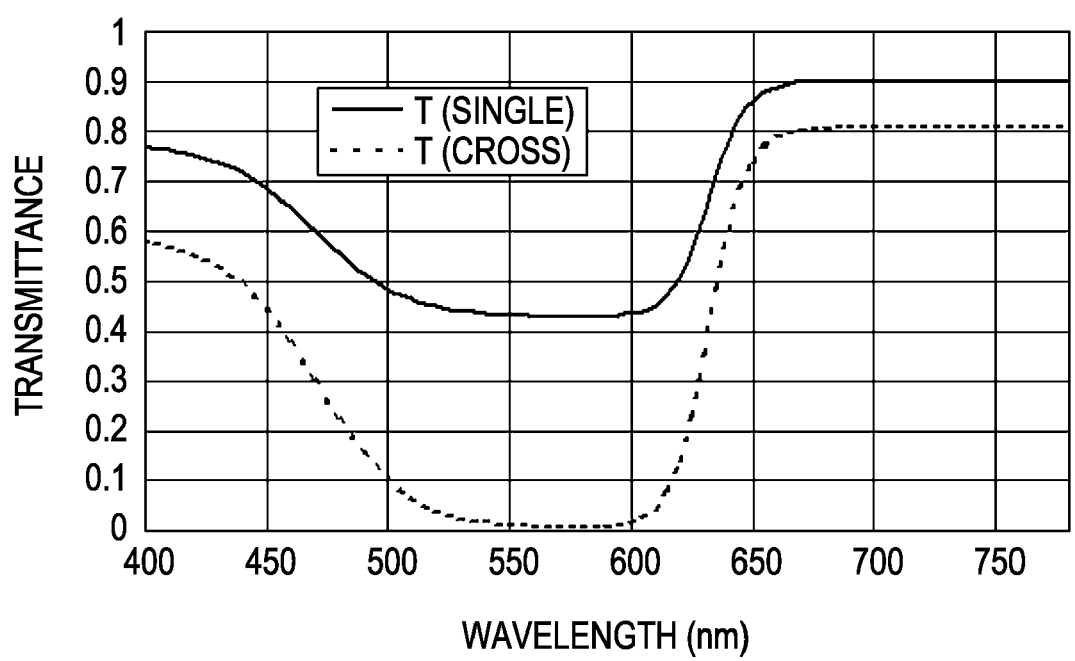
FIG. 20 is a graph showing the spectral transmittance of an RB transmissive circularly polarizing member and the spectral transmittance of a crossed Nicol prism.

An RB transmissive circularly polarizing member 142 is provided above the B-absorbing layer 133 with an adhesive disposed therebetween, whereby the display apparatus is obtained. FIG. 20 shows the spectral transmittance $T(\lambda)$ of the RB transmissive circularly polarizing member 142 as a solid line and the spectral transmittance $T_c(\lambda)$ of a crossed Nicol prism as a broken line.

Sixth Embodiment

Figure 21:
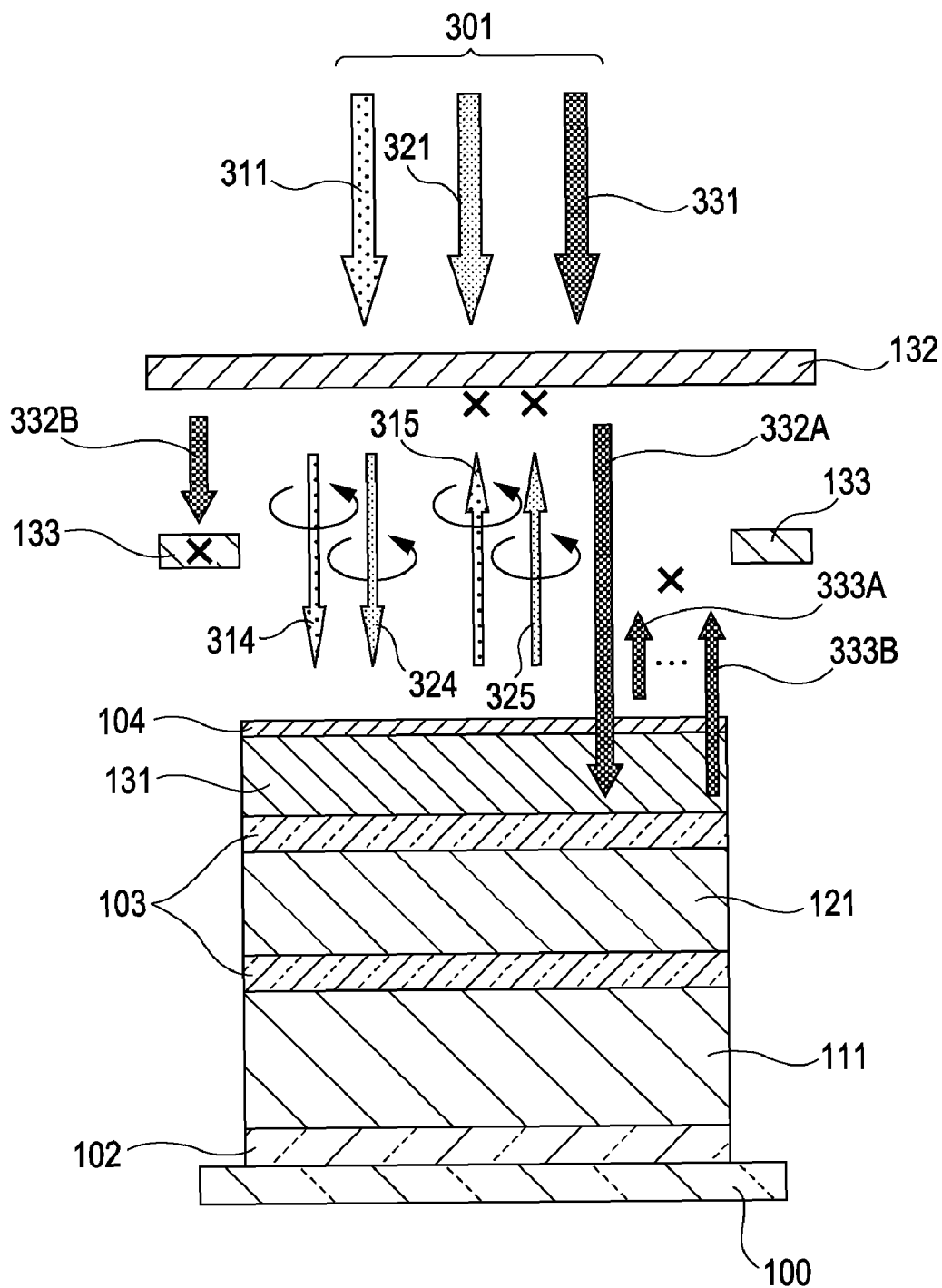
FIG. 21 is a sectional view of an organic EL display apparatus according to a sixth embodiment of the present invention.

A display apparatus having a configuration shown in FIG. 21 is manufactured as described below. The configuration of this display apparatus is substantially the same as that of the display apparatus of the first embodiment except that pixels included in this display apparatus each include an R, a G, and a B sub-pixel that are not arranged horizontally above a substrate but are arranged vertically above the substrate.

Organic EL diode sections are each formed by depositing the following layers and electrodes on a reflective electrode 102 in this order: an R organic layer 111, a transparent electrode 103, a G organic layer 121, a transparent electrode 103, an organic layer 131, a translucent electrode 104, and a protective layer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Application No. 2006-094556 filed Mar. 30, 2006, and the benefit of Japanese Application No. 2007-027942 filed Feb. 7, 2007, which are hereby incorporated by reference herein in its entirety.

What is claimed is:

1. A display apparatus comprising:
   a substrate;
   a plurality of pixels, arranged above the substrate, each pixel including a plurality of sub-pixels emitting light of different colors;
   a circularly polarizing member disposed above the pixels, the transmittance of light of a selected one color of said different colors through the circularly polarizing member being higher than that of light of the other of said different colors therethrough; and
   a light-absorbing member disposed only above the sub-pixels, emitting light of the other of said different colors, wherein the light-absorbing member absorbs light of the selected color.

2. The display apparatus according to claim 1, wherein the sub-pixels each include a light-emitting diode including a first electrode, a light-emitting layer, and a second electrode arranged above the substrate in that order; the light-emitting diode having a first reflecting plane located at a position closer to the first electrode than the light-emitting layer and a second reflecting plane located at a position closer to the second electrode than the light-emitting layer; and the optical distance between the first and second reflecting planes is set such that an external light component which is reflected by the first reflecting plane and which has a wavelength corresponding to the selected color interferes with an external light component which is reflected by the second reflecting plane and which has a wavelength corresponding to the selected color, thereby attenuating the external light components.

3. The display apparatus according to claim 1, wherein the sub-pixels are arranged above the substrate.

4. The display apparatus according to claim 1, wherein a spectral transmittance of the light-absorbing member has a global or local minimum at a wavelength corresponding to the selected color.

5. The display apparatus according to claim 1, wherein the sub-pixels emitting light of the selected color have the lowest light-emitting efficiency.

6. The display apparatus according to claim 1, wherein the sub-pixels emitting light of the selected color have the shortest half-decay lifetime.

7. The display apparatus according to claim 1, wherein the sub-pixels emitting light of the selected color have the highest driving current density.

8. The display apparatus according to claim 1, wherein the sub-pixels include organic electroluminescent diodes.

9. The display apparatus according to claim 1, wherein the sub-pixels include red light-emitting diodes, green light-emitting diodes, and blue light-emitting diodes and the selected color is red, blue or a combination of red and blue.

* * * * *